US010225927B2

(12) United States Patent
Morimoto et al.

(10) Patent No.: US 10,225,927 B2
(45) Date of Patent: Mar. 5, 2019

(54) STRUCTURE OF SUBSTRATE HAVING ELECTRONIC PARTS MOUNTED THEREON AND CASE FOR HOUSING THE SUBSTRATE

(71) Applicant: NSK LTD., Tokyo (JP)

(72) Inventors: Masakazu Morimoto, Tokyo (JP); Noboru Kaneko, Tokyo (JP); Shin Kumagai, Tokyo (JP)

(73) Assignee: NSK LTD., Tokyo (JP)

( * ) Notice: Subject to any disclaimer, the term of this patent is extended or adjusted under 35 U.S.C. 154(b) by 0 days.

(21) Appl. No.: 15/774,815

(22) PCT Filed: Nov. 25, 2016

(86) PCT No.: PCT/JP2016/084908
§ 371 (c)(1),
(2) Date: May 9, 2018

(87) PCT Pub. No.: WO2017/094601
PCT Pub. Date: Jun. 8, 2017

(65) Prior Publication Data
US 2018/0343737 A1    Nov. 29, 2018

(30) Foreign Application Priority Data

Dec. 2, 2015  (JP) ................................. 2015-235688
Feb. 22, 2016 (JP) ................................. 2016-030939
May 11, 2016 (JP) ................................. 2016-095232

(51) Int. Cl.
*H05K 7/20*     (2006.01)
*H05K 1/02*     (2006.01)
(Continued)

(52) U.S. Cl.
CPC ....... *H05K 1/0271* (2013.01); *B60R 16/0231* (2013.01); *H05K 1/0203* (2013.01);
(Continued)

(58) Field of Classification Search
CPC .. H05K 1/0271; H05K 1/0203; H05K 5/0017; H05K 7/1427; H05K 2201/068; B60R 16/0231; B62D 5/04
(Continued)

(56) References Cited

U.S. PATENT DOCUMENTS

2004/0051221 A1    3/2004  Sunadome
2005/0152118 A1*   7/2005  Cho ......................... G06F 1/20
                                                                361/707

FOREIGN PATENT DOCUMENTS

JP    2004-31495 A    1/2004
JP    2004-87569 A    3/2004
(Continued)

OTHER PUBLICATIONS

International Search Report for PCT/JP2016/084908 dated Feb. 7, 2017 [PCT/ISA/210].

*Primary Examiner* — Mandeep S Buttar
(74) *Attorney, Agent, or Firm* — Sughrue Mion, PLLC

(57) ABSTRACT

A substrate provided in proximity to a case for improving heat radiation, and maintaining electrical insulation between the substrate and the case even when the substrate is warped, in the substrate having electronic parts mounted thereon and a case for housing the substrate. A case body of the case has a substrate placement surface for placing the substrate, the substrate placement surface is provided with a protruding portion protruding therefrom, and the substrate is fixed on the substrate placement surface, via a thermal interface material disposed on the substrate placement surface from a periphery of the protruding portion.

13 Claims, 17 Drawing Sheets

(51) Int. Cl.
*H05K 5/00* (2006.01)
*B60R 16/023* (2006.01)
*H05K 7/14* (2006.01)
*B62D 5/04* (2006.01)

(52) U.S. Cl.
CPC ......... *H05K 5/0017* (2013.01); *H05K 7/1427* (2013.01); *B62D 5/04* (2013.01); *H05K 2201/068* (2013.01)

(58) Field of Classification Search
USPC ........................................ 361/707, 704, 719
See application file for complete search history.

(56) References Cited

FOREIGN PATENT DOCUMENTS

| | | |
|---|---|---|
| JP | 2005-142228 A | 6/2005 |
| JP | 2014-36033 A | 2/2014 |
| JP | 2014-49610 A | 3/2014 |
| JP | 2015-35906 A | 2/2015 |

\* cited by examiner

ENLARGED VIEW OF AREA INDICATED AS "L" OF FIG.10C $$\begin{cases} \Delta V = \Delta V_0 + \sqrt{R^2 - X_2^2} \\ \quad = \Delta V_0 + X_1 \\ \Delta H = \Delta H_0 + \sqrt{R^2 - X_1^2} \\ \quad = \Delta V_0 + X_2 \end{cases}$$

STRUCTURE OF SUBSTRATE HAVING ELECTRONIC PARTS MOUNTED THEREON AND CASE FOR HOUSING THE SUBSTRATE

CROSS REFERENCE TO RELATED APPLICATIONS

This application is a National Stage of International Application No. PCT/JP2016/084908, filed on Nov. 25, 2016, which claims priority from Japanese Patent Application Nos. 2015-235688, filed on Dec. 2, 2015, 2016-030939, filed on Feb. 22, 2016, and 2016-095232, filed on May 11, 2016.

TECHNICAL FIELD

The present invention relates to a structure of a substrate having electronic parts mounted thereon and a case for housing the substrate. With the structure, it is possible to improve a heat radiation by arranging, via a thermal interface material, the substrate having the electronic parts mounted thereon in proximity to a substrate placement surface for placing the substrate, which is provided in the case for housing the substrate.

BACKGROUND ART

For years, there has been a demand for further miniaturization of an electronic circuit using a power semiconductor or the like which handles high power, such as an inverter circuit and a power supply circuit, in association with the miniaturization of devices using such circuits.

In association with the miniaturization of the devices, a substrate has been developed for exclusive use for an electronic circuit which handles the high power, such as the inverter circuit and the power supply circuit, to be employed in an electric power steering apparatus (EPS) for use in, for example, vehicles such as automobiles.

In order to achieve the development of the substrate intended for the exclusive use for such a power semiconductor, an important issue is how to radiate the heat due to a loss of, for example, the power semiconductor mounted with high density. As a conventional dedicated substrate of this type, such as a power substrate using the power semiconductor, a substrate having a metal supporting plate made of, for example, aluminum with its surface laminated with a conductive foil (a copper foil) through a thin insulator layer, is used. A wiring pattern is formed on the substrate while the conductive foil is etched. Meanwhile, as a control substrate, for example, a layered resin substrate with four or more layers, having a dedicated microcomputer mounted thereon, is used. A control unit has two substrates, that is, a control substrate and a power substrate, as described above, stacked in two layers vertically.

Therefore, in order to reduce the size and the thickness of the control unit as described above, there is an increasing demand for compounding such the two substrates stacked vertically in two layers into a single multilayer substrate. The high-density mounting of a power module section (mainly an inverter circuit) constituting such an integrated resin multilayer substrate (single substrate) is further implemented by, for example, the incorporation of a redundant circuit and the duplication of sensors. Thus, the heat generated from the power module section is released into a housing (case) storing the substrate via a thermal interface material (TIM) filled in minute gaps.

With regard to such a structure, there exists a demand for narrowing, as far as possible, the above-described gaps so as to improve the heat conductivity. On the contrary, when the contact between the substrate and the case due to a warpage of the substrate is caused due to excessively narrow gaps, there is possibly a problem that an unnecessary electrical contact between the substrate and the case may occur.

In other words, since the multilayer substrate made of resin is used instead of the metal supporting plate in the formation of the power substrate into the integrated substrate with the multilayer structure compounded as described above, the heat radiation is reduced in the conventional power substrate being formed on the metal supporting plate made of the aluminum or the like. Therefore, the heat conduction from the electronic parts mounted on the resin substrate as described above is conducted from the electronic parts through a wiring layer made of the copper foil to the resin substrate and its adhesion layer, and further is conducted from the back surface of the substrate via the TIM to a heatsink of the case. However, generally, since a wiring pattern is also formed on the back surface of the substrate, in a case that the warpage of the substrate occurs, there is possibly a problem that the substrate escapes from the TIM and comes into the contact with the case, and further an electrical contact may occur at an undesired position between the substrate and the case.

In order to solve such a problem, as schematically shown in, for example, FIG. 17, a method of securing a large clearance (a gap between the integrated substrate and the case) is adopted so as to prevent the electrical contact at the undesired position between the case 1000C and a wiring surface on the back surface side (the lower side in FIG. 17) of the integrated substrate 1000B including through holes TH and so on.

However, when the large clearance is secured as described-above, a thermal resistance increases with it. Thus, the width of the TIM needs to increase so as to fill the large clearance. In addition, there has been a problem of a high manufacturing cost since the TIM of a higher performance (for example, a TIM having a high heat conductivity of 2.6 [W/mK]) involves a higher cost.

Furthermore, for example, the technique described in Japanese Published Unexamined Patent Application No. 2004-31495 A (Patent Document 1) and that described in Japanese Published Unexamined Patent Application No. 2005-142228 A (Patent Document 2) have been disclosed so as to solve the above-described problem.

Patent Document 1 describes that: "As the thickness of a heat radiation member is reduced as a means for improving radiation performance, a printed circuit board and an electronic control unit (ECU) housing may come into contact with each other to cause, for example, a short circuit due to the effect of a warpage of the printed circuit board and difficulties in maintaining processing accuracy of the ECU housing. Thus, there arises a problem of a malfunction of an electronic device." Under the recognition of the above-described technical problem, an object of Patent Document 1 is "to provide a heat radiation structure of an electronic device capable of improving radiation performance by minimizing the distance between a printed circuit board and a housing, without causing a malfunction of the electronic device".

In order to solve the above-described problem, the technique described in Patent Document 1 adopts the configuration that a contact prevention means for preventing a contact between a housing and a circuit board is formed, between the housing and the circuit board, at a position different from the position of a wiring pattern formed on the circuit board. The contact prevention means is formed on the circuit board or the housing as a protrusion having a predetermined height.

The technique described in Patent Document 2 adopts the following power module structure. Plural inverter modules are attached, with the gaps, to the upper surface of a single module base section. Wirings connected to the inverter modules are extended from the inverter modules to the outside of the module base section. A locking tool disposition section for locking a radiator plate contacting the lower surface of the module base section is provided between the inverter modules.

THE LIST OF PRIOR ART DOCUMENTS

Patent Documents

Patent Document 1: Japanese Published Unexamined Patent Application No. 2004-31495 A
Patent Document 2: Japanese Published Unexamined Patent Application No. 2005-142228 A

SUMMARY OF THE INVENTION

Problems to be Solved by the Invention

In the technique described in Patent Document 1, protrusions having predetermined heights T' are formed on a housing side so as to prevent contact between the housing and a circuit board, and minute clearances are formed between the ends of the protrusions and the circuit board.

The circuit board and the housing are disposed in proximity to each other. When the warpage of the circuit board occurs, the protrusions with the heights T' are brought into a contact with the circuit board at positions different from the position of the wiring pattern of the warped circuit board, so as to avoid the contact between the circuit board and the housing at a position other than those of the protrusions.

However, according to the technique described in Patent Document 1, it is not necessarily clear whether the protrusions come into a contact with the circuit board or not, and thus, there is a possibility that a section having the wiring pattern may come into the contact with the housing.

Further, the technique described in Patent Document 1 is intended only for the situation where the circuit board is distorted in a direction perpendicular to a plane constituting the circuit board, and does not consider the situation where a distortion in a direction horizontal to the plane constituting the circuit board occurs along with the distortion in the perpendicular direction. In addition, in order to secure a sufficient clearance between the circuit board and the housing, the amount of the TIM used for filling the clearance increases.

Thus, when the distortion also occurs in the directions perpendicular to and horizontal to the circuit board due to, for example, the generation of the heat, the distortion in the horizontal direction becomes excessive especially when, for example, the wiring pattern is densely formed on the circuit board. As a result, there is a possibility that the protrusions may be brought into the contact with the circuit board at the position of the wiring pattern. Accordingly, in such a case, there is a problem that it is impossible to securely prevent the electrical contact at the undesired position between the circuit board and the housing.

Moreover, the object of the technique described in Patent Document 2 is to deal with the warpage that occurs at the base of the power module due to the influence of the heat or the like in a configuration that plural inverter modules are housed in a single power module and a radiator plate is mounted on the base of the module.

However, the technique described in Patent Document 2 relates to the power module structure for the inverter, as follows. A PN-bus bar is disposed between two modules for running and charging. A U-output terminal, a V-output terminal and a W-output terminal are disposed at both sides of the PN-bus bar, and a P-input terminal and an N-input terminal are disposed at two positions, so that a vacant area not occupied by the bus bar is formed in the central section of the module. Bolt holes are formed in the peripheral section of the module and in the vacant area to form a bolt-fixed module structure.

Consequently, the technique described in Patent Document 2 is based on the premise that complex processing is performed on the power module (substrate) side, and since occurrence of the warpage is suppressed by the fixing with the bolts, there is a risk of damage in the substrate due to an increase in internal stress under severe circumstances.

Meanwhile, in recent years, an electromagnetic compatibility (EMC) is required for a control unit as described above, and there is a demand for reducing the noise from a viewpoint of, for example, enhancement of the compatibility and the high-precision control. However, since the techniques described in Patent Documents 1 and 2 do not consider, for example, measures for the EMC, there is a problem that an improvement thereof cannot be expected.

The present invention has been made with a view to solving the above-described problems, and an object of the present invention is to reduce an adverse effect caused by the occurrence of the warpage due to the thermal deformation, an aged deterioration or the like while promoting the active conduction of the heat between the substrate and the substrate placement surface of the case, by disposing the substrate in proximity to the substrate placement surface as much as possible, so as to increase the heat radiation.

Means for Solving the Problems

In order to solve the above-described problems, the present invention provides a structure of a substrate having electronic parts mounted thereon and a case for housing the substrate, wherein the case has a substrate placement surface for placing the substrate, the substrate placement surface is provided with a protruding portion protruding therefrom, and the substrate is fixed on the substrate placement surface, via a thermal interface material having an insulation property disposed on the substrate placement surface from a periphery of the protruding portion.

The solution of the above-described problems is efficiently achieved by that: wherein when the substrate is disposed on the substrate placement surface, the protruding portion is provided at or in a vicinity of a position to be opposed to a position that is predicted as a center of a warpage due to a thermal deformation of the substrate or a geometric center of the substrate placement surface or in a vicinity of the geometric center.

The solution of the above-described problems is efficiently achieved by that: wherein a height of the protruding portion protruding from the substrate placement surface is equal to a height of the thermal interface material disposed on the substrate placement surface from the periphery of the protruding portion, from the substrate placement surface; or wherein an insulator part of the substrate is disposed at apart of the substrate to be opposed to the protruding portion on the substrate placement surface when the substrate is mounted on the substrate placement surface of the case.

The solution of the above-described problems is efficiently achieved by that: wherein the substrate placement surface is formed of a conductor, and wherein the protruding portion is brought into a contact with the substrate at an electrical ground wiring part of a circuit pattern formed on a side of the substrate facing the substrate placement surface; or wherein the substrate is a multilayer substrate, wherein the multilayer substrate is provided with a through hole mutually connecting the electrical ground wiring parts of the circuit patterns formed on respective layers of the multilayer substrate, and wherein the electrical ground wiring part of the circuit pattern formed on the side of the substrate facing the substrate placement surface of the case, includes a land part of the through hole, formed on the side of the multilayer substrate facing the substrate placement surface.

The solution of the above-described problems is efficiently achieved by that: wherein the plural protruding portions are provided on the substrate placement surface.

The solution of the above-described problems is efficiently achieved by that: wherein a hole portion is formed on a back surface side of the substrate at a position to be opposed to the protruding portion of the substrate placement surface based on the fixation, wherein the protruding portion has a truncated cone shape with the substrate placement surface as a base, wherein an upper base section of the protruding portion enters inside the substrate from the hole portion provided in the substrate on the back surface side of the substrate due to that a diameter of an upper base of the truncated cone shape is smaller than an inner diameter of the hole portion of the substrate, a diameter of a lower base of the truncated cone shape is larger than the inner diameter of the hole portion of the substrate, and a height of the truncated cone shape is larger than a distance between the substrate placement surface and a back surface of the substrate based on the fixation, and wherein when the substrate deforms due to the warpage in a direction of the substrate placement surface, an expansion of a warpage is suppressed by an opening of the hole portion on the back surface side of the substrate coming into a contact with an inclined surface of the truncated cone shape forming the protruding portion; or wherein the hole portion of the substrate is formed to penetrate through the substrate from a front surface to the back surface, and wherein the height of the truncated cone shape forming the protruding portion is lower than the height from the substrate placement surface to the front surface of the substrate based on the fixation.

The solution of the above-described problems is efficiently achieved by that: wherein the opening of the hole portion on the back surface side of the substrate, which is to be brought into a contact with the inclined surface of the truncated cone shape forming the protruding portion of the case, is formed of an insulator section of the substrate; or wherein a tapered surface parallel to the inclined surface of the truncated cone shape is provided on the opening of the hole portion on the back surface side of the substrate, which is to be brought into a contact with the inclined surface of the truncated cone shape forming the protruding portion of the case.

The solution of the above-described problems is efficiently achieved by that: wherein the substrate placement surface has a heat radiation function; or wherein the mounting of the substrate on the substrate placement surface is implemented while the substrate is locked with both or either plural locking sections projecting from the substrate placement surface configured to mount the substrate and/or plural substrate locking pillars disposed on a periphery of the substrate placement surface, and wherein a height of an upper end of the locking section and a height of an upper end of the substrate locking pillar are substantially equal to a height of the thermal interface material from the substrate placement surface, as viewed from the substrate placement surface; or wherein the substrate is an integrated substrate formed of a power substrate and a control substrate integrated as a single substrate, and wherein at least a power module section of the integrated substrate, formed on the power substrate, is disposed on the substrate placement surface of the case; or an electric power steering apparatus comprising a control unit having the structure of the substrate having electronic parts mounted thereon and the case for housing the substrate.

Effects of the Invention

In relation to a substrate having electronic parts mounted thereon and a case for housing the substrate, the present invention adopts a structure in which a substrate placement surface of the case is provided with a protruding portion capable of receiving a warpage due to various causes such as a weight of the substrate, a heat generation from the substrate and an aged deterioration of the substrate.

Therefore, according to the present invention, it is possible to dispose the substrate and the case in proximity to each other as much as possible so as to improve the heat radiation. Thus, it is possible to obtain the basic effect of preventing the electrical contact at an undesired position between the substrate and the case even if the warpage of the substrate occurs due to a thermal deformation or an increase of a load caused by an acceleration or the like.

In addition, according to each configuration example of the present invention, it is also possible to further obtain the following effects.

That is, it is possible to appropriately deal with the warpage of the substrate by disposing the protruding portion at a position opposed to a position that is predicted as the center of the warpage due to the thermal deformation of the substrate.

Furthermore, when the protruding portion is configured to come into a contact with an electrical ground wiring section of a circuit pattern formed on the substrate, it is possible to achieve the following by forming a connection through the case which functions as the electrical ground, further to the electrical ground wiring outside the case. Then, the noise is reduced by a reduction in the common impedance of the substrate. As a result, it is possible to improve an electromagnetic environment compatibility. Moreover, since the protruding portion also functions as a heat conductive member of the heat generated from the substrate, the protruding portion can more actively and effectively conduct the heat generated from the substrate through an electrical ground wiring section of the circuit pattern formed on the substrate, to the case. Thus, the case can radiate the heat conducted as described above further to an external environment.

Suppose that the following configuration is adopted. The protruding portion is formed in a truncated cone shape. A hole portion is formed in a part of the substrate, which is to be opposed to the protruding portion on the substrate placement surface when the substrate is disposed on the substrate placement surface of the case. The hole portion is formed in a manner to allow the upper base of the truncated cone-shaped protruding portion to enter the hole portion without coming into the contact with the substrate. When this configuration is adopted, the opening of the hole portion formed in the substrate is to come into the contact with an inclined surface of the truncated cone shape. Therefore, it is possible to deal with the distortion of the substrate and limit the distortion within a certain range, not only when the substrate is distorted in a direction perpendicular to a plane constituting the substrate, that is, a deformation in the vertical direction occurs due to the warpage, but also when the distortion in a direction horizontal to the plane constituting the substrate occurs along with the distortion in the vertical direction. Furthermore, when a tapered surface or the like parallel to the inclined surface of the truncated cone shape is provided at the opening on the back surface side of the hole portion of the substrate, it is possible to further expand the extent of the warpage and distortion to be dealt with. In addition, it is also possible to mitigate a stress on the contact surface between the substrate and the protruding portion by smoothing the contact surface therebetween.

BRIEF DESCRIPTION OF THE DRAWINGS

In the accompanying drawings:

FIG. 8A is an enlarged top view of a cross section of the outer periphery of a screw 360 and the inner periphery of a screw hole 403 formed in the substrate, and FIG. 8B is a top view showing an example of the entire substrate with the screw holes thereof in an elliptical shape;

FIG. 16A is a top view showing an example of the entire substrate with screw holes thereof having a circular inner diameter which is larger than an outer diameter of a shank of a screw, and FIG. 16B shows a comparison between a top view of the screw hole of the substrate and a sectional side view of the substrate fixed with the screw.

MODE FOR CARRYING OUT THE INVENTION

Hereinafter, embodiments of the present invention will be described with examples of applying configuration examples of a substrate having electronic parts mounted thereon and a case for housing the substrate according to the present invention, to a control unit of an electric motor used in, for example, an electric power steering apparatus (EPS) for a vehicle.

Here, the electric power steering apparatus provides a steering mechanism of the vehicle with a steering assist torque (an assist torque) by means of a rotational torque of an electric motor. The electric power steering apparatus applies a driving force of the motor, which is controlled by electric power supplied from an electric power supplying section (an inverter), to a steering shaft or a rack shaft by means of a transmission mechanism such as gears or a belt through a reduction mechanism. In order to accurately generate the steering assist torque, such an electric power steering apparatus (EPS) performs a feed-back control of a motor current.

Such a feed-back control adjusts a voltage supplied to the electric motor so that a difference between a steering assist command value (a current command value) and a detected motor current value becomes small, and the adjustment of the voltage supplied to the electric motor is generally performed by an adjustment of duty command values of a pulse width modulation (PWM) control.

Figure 1:
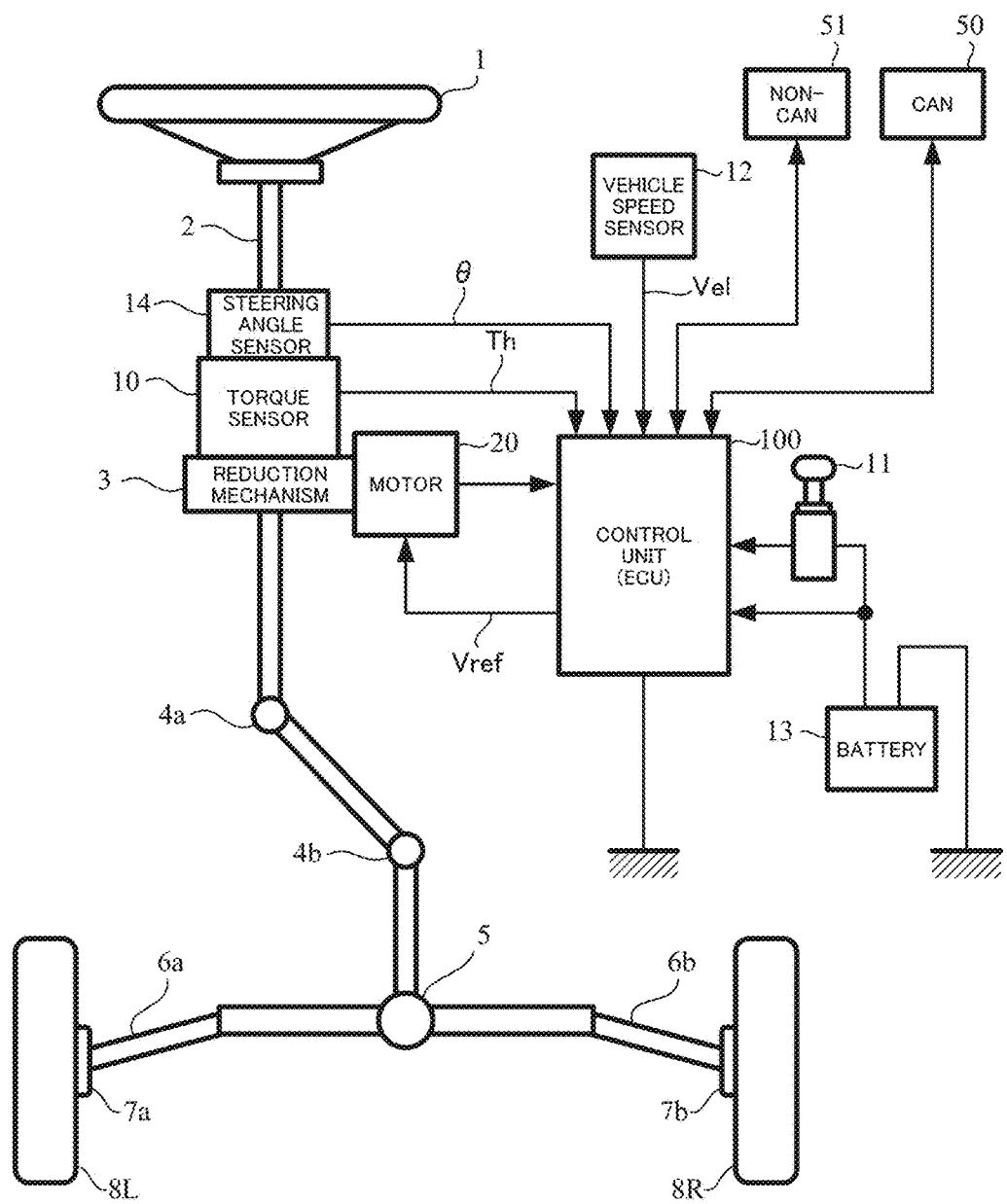
FIG. 1 is a configuration diagram showing a general configuration of an electric power steering apparatus.

A general configuration of the above-described electric power steering apparatus will be described with reference to FIG. 1. As shown in FIG. 1, a column shaft (a steering shaft or a handle shaft) 2 connected to a handle 1 is connected to steered wheels 8L and 8R through a reduction mechanism 3, universal joints 4a and 4b, a pinion-and-rack mechanism 5, and tie rods 6a and 6b, further via hub units 7a and 7b. In addition, the steering shaft 2 is provided with a torque sensor 10 for detecting a steering torque Th of the handle 1 and a steering angle sensor 14 for detecting a steering angle θ, and a motor 20 for assisting the steering torque of the handle 1 is connected to the column shaft 2 through reduction gears (a gear ratio n) of the reduction mechanism 3.

The electric power is supplied to a control unit (ECU) 100 for controlling the electric power steering apparatus from a battery 13, and an ignition key signal is inputted into the control unit 100 through an ignition key 11.

The control unit 100 calculates a current command value of an assist command (a steering assist command) on the basis of the steering torque Th detected by the torque sensor 10 and a vehicle speed Vel detected by a vehicle speed sensor 12, and controls a current supplied to the electric motor 20 by means of a voltage control value Vref obtained by performing compensation or the like to the calculated current command value. The steering angle sensor 14 is not indispensable and may not be provided. It is possible to obtain the steering angle from a rotational position sensor such as a resolver, which is connected to the electric motor 20.

A controller area network (CAN) 50 to send/receive various information and signals on the vehicle is connected to the control unit 100, and it is also possible to receive the vehicle speed Vel from the CAN. Further, a Non-CAN 51 is also possible to connect to the control unit 100, and the Non-CAN 51 sends and receives a communication, analogue/digital signals, electric wave or the like except for the CAN 50.

Figure 2:
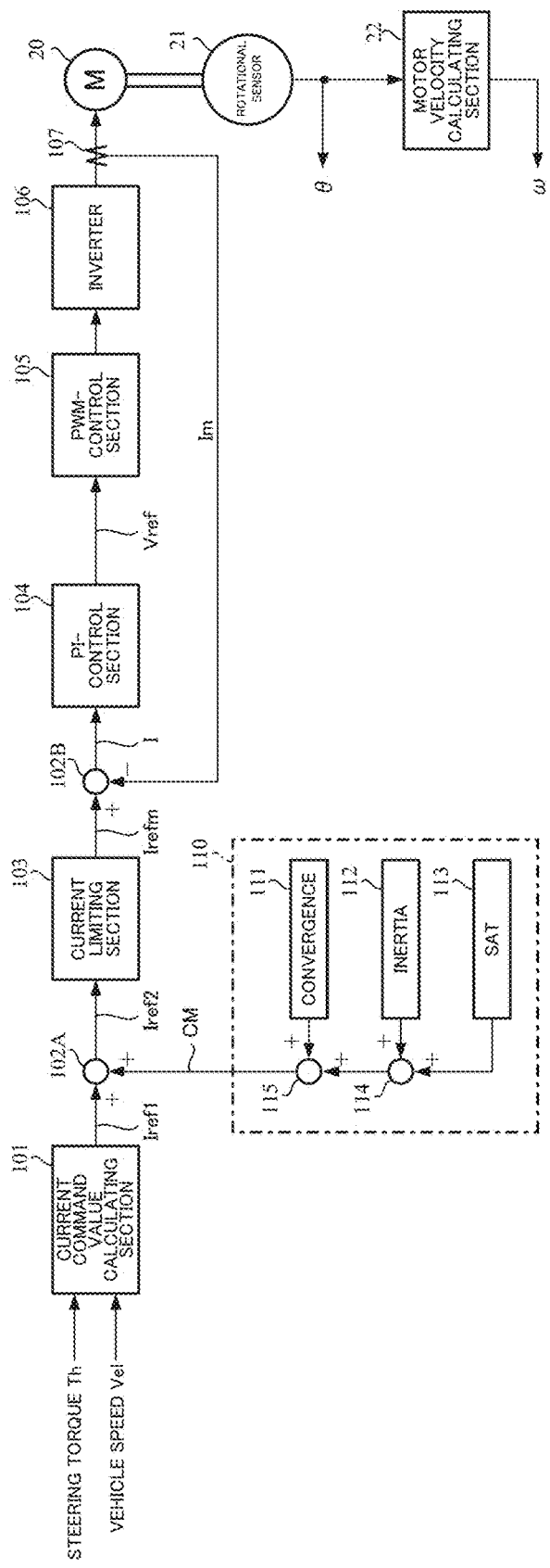
FIG. 2 is a block diagram showing a control unit (ECU) of the electric power steering apparatus.

The control unit 100 mainly comprises a CPU (Central Processing Unit) (including an MPU (Micro Processor Unit) and an MCU (Micro Controller Unit)), and general functions performed by programs within the CPU are, for example, shown in FIG. 2.

The control unit 100 will be described with reference to FIG. 2. As shown in FIG. 2, the steering torque Th detected by the torque sensor 10 and the vehicle speed Vel detected by the vehicle speed sensor 12 (or from the CAN 50) are inputted into a current command value calculating section 101 which calculates the current command value Iref1. The current command value calculating section 101 calculates the current command value Iref1, based on the steering torque Th and the vehicle speed Vel with reference to an assist map or the like, which is a control target value of a current supplied to the electric motor 20. The calculated current command value Iref1 is inputted into a current limiting section 103 via an adding section 102A, and the current command value Irefm whose maximum current is limited is inputted into a subtracting section 102B. A deviation I (=Irefm−Im) between the current command value Irefm and a motor current value Im which is fed-back is calculated at the subtracting section 102B, and the deviation I is inputted into a proportional-integral-control section (PI-control section) 104 for improving a current characteristic of the steering operation. The voltage control command value Vref that the characteristic is improved at the PI-control section 104, is inputted into a PWM-control section 105, and the electric motor 20 is PWM-driven through an inverter 106. The current value Im of the electric motor 20 is detected by a motor current detector 107 and is fed-back to the subtracting section 102B. The inverter 106 is constituted by a bridge circuit of field-effect transistors (FETs) as a driving device.

The rotational sensor 21 such as the resolver is connected to the motor 20 and a motor rotational angle θ is outputted. Further, a motor velocity ω is calculated at a motor velocity calculating section 22.

Furthermore, a compensation signal CM from a compensation signal generating section 110 is added at the adding section 102A. A characteristic compensation of the steering system is performed by adding the compensation signal CM, and a convergence, an inertia characteristic, and the like are improved. The compensation signal generating section 110 adds a self-aligning torque (SAT) 113 to an inertia 112 at an adding section 114. The addition result is further added with a convergence 111 at an adding section 115. The addition result at the adding section 115 is treated as the compensation signal CM.

In the electric power steering apparatus configured as described above, the substrate having the electronic parts mounted thereon and the case for housing the substrate according to the present invention, house the control unit 100 and the like. For example, the substrate and case are configured as follows. As well, in the following description, the same reference signs are used for the same elements even if the elements can take other forms. In addition, duplicated descriptions or configurations may be omitted in some cases. Furthermore, the size, ratio, and the like of each element shown in the drawings may be different from the actual ones for convenience of the description.

Figure 3:
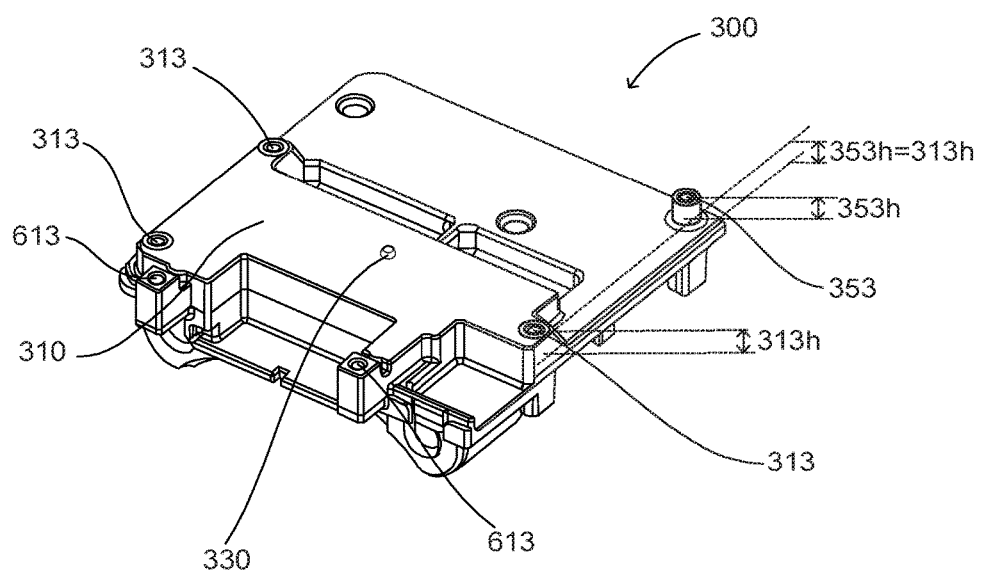
FIG. 3 is a perspective view showing an example of a case body according to the present invention.
Figure 5:
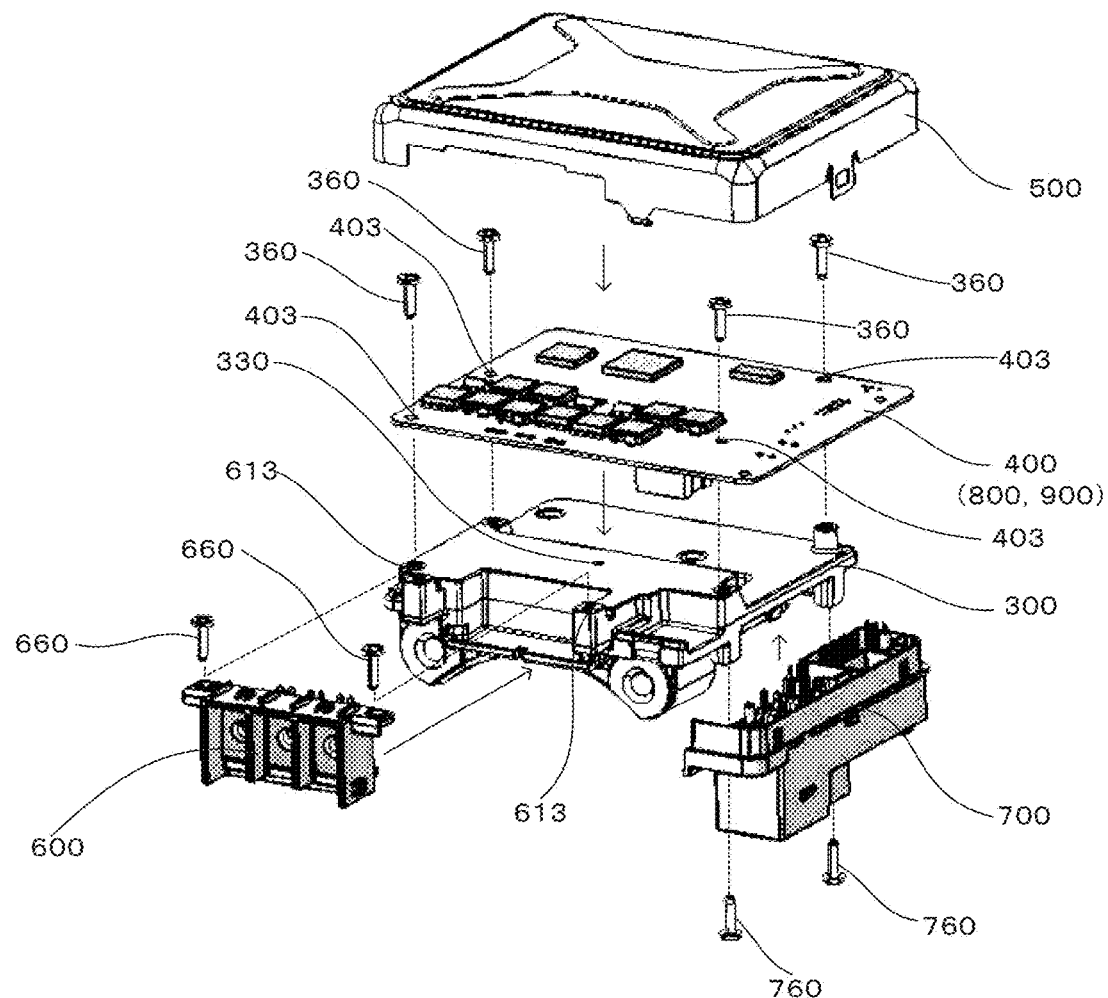
FIG. 5 is a perspective view of the case body according to the present invention and related elements.

The present invention relates to a structure of the substrate having the electronic parts mounted thereon and the case for housing the substrate. For example, the case includes a case body 300, as shown in FIG. 3, and a case cover 500 to be combined with the case body 300, as shown in FIG. 5 to be described below. In some cases, a connector 700, a terminal 600 and the like may be combined and integrated with the case body 300 and the case cover 500, and may be collectively referred to as a case. Here, FIG. 3 is a perspective view of the case body 300 according to the present invention, and FIG. 5 is a perspective view of the case body 300 according to the present invention and related elements.

The case body 300 according to the present invention has a substrate placement surface 310 as shown in FIG. 3, for placing a substrate 400 having the electronic parts mounted thereon as shown in FIG. 5. The substrate placement surface 310 is provided with a protruding portion 330 formed as a protrusion.

Among the above, as shown in FIG. 5, the case body 300 constitutes a part of the case for housing the substrate 400 having the electronic parts mounted thereon. The case body 300 is basically used in combination with the case cover 500.

The case body 300 is made of, for example, an aluminum alloy such as "ADC12" or a heat conductive resin. A heatsink or a radiator is attached to the entire case or a part of the case. Alternatively, the case as a whole is configured as the radiator so as to achieve a heat radiation function.

In addition, among the above, the substrate placement surface 310 is used for placing the substrate 400 having the electronic parts mounted thereon in the case body 300, and also for transmitting the heat generated from the substrate 400 to the case body 300.

Figure 4A:
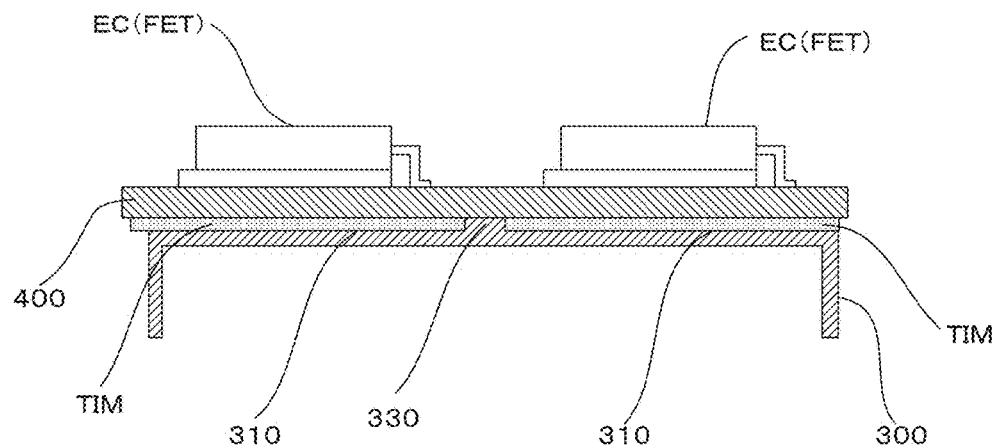
FIG. 4A is a sectional side view of a substrate disposed, via a thermal interface material, on a substrate placement surface of a case body according to the first configuration example of the present invention, taken along a line through a protruding portion provided on the substrate placement surface of the case.
Figure 4B:
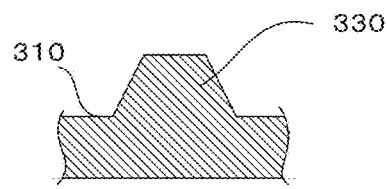
FIGS. 4B and 4C are sectional side views showing examples of a cross-sectional shape of the protruding portion.
Figure 4C:
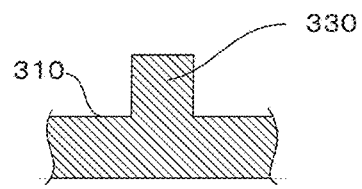
Figure 4D:
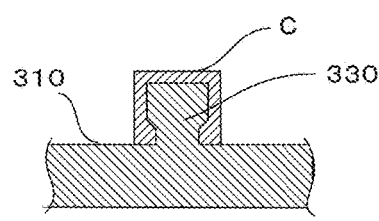
FIGS. 4D and 4E are sectional side views showing examples of covering the protruding portion with a cap.
Figure 4E:
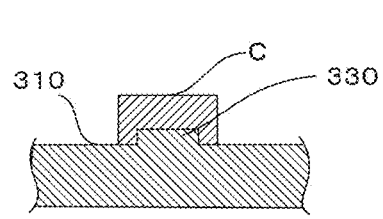

Therefore, the substrate placement surface 310 is formed in a planar manner in accordance with the substrate 400 to be placed in the case body 300. In addition, a thermal interface material TIM having a high thermal conductivity is disposed between the substrate 400 and the substrate placement surface 310, as shown in, for example, FIG. 4A to be described later. Here, FIG. 4A is a sectional side view of the substrate 400 disposed, via the thermal interface material TIM, on the substrate placement surface 310 of the case body 300 according to the first configuration example of the present invention, taken along a line through the protruding portion 330 provided on the substrate placement surface 310 of the case 300. An example of arranging the FETs as the electronic parts EC on the substrate 400 is exemplified here. Similarly, FIGS. 4B and 4C are sectional views showing examples of a cross-sectional shape of the protruding portion 330. FIGS. 4D and 4E are sectional views showing examples of a cross-sectional shape of the protruding portion 330 covered with a cap C.

Returning to FIG. 3, the description will be continued. It is possible to dispose or mount the substrate 400 on the substrate placement surface 310 by locking the substrate 400 with both or either plural locking sections 313 projecting from the substrate placement surface 310 for mounting the substrate 400 and/or a substrate locking pillar 353 disposed on the periphery of the substrate placement surface 310 of the case body 300. The height of the upper end of the locking section 313 from the substrate placement surface 310 and the height of the upper end of the substrate locking pillar 353 from the substrate placement surface 310 are equal to (the same as) or slightly lower than the height of the thermal interface material TIM to be filled from the substrate placement surface 310, so that the substrate 400 and the substrate placement surface 310 are disposed in close contact with each other via the thermal interface material TIM.

Then, among the above, the protruding portion 330 formed on the substrate placement surface 310 is a protrusion formed upward in a protruding shape on the substrate placement surface 310. The protruding portion 330 is disposed in the following manner. Even if the warpage of the substrate 400 occurs, an unnecessary contact without involving the thermal interface material TIM does not occur at any point other than the protruding portion 330, between a circuit pattern formed on the back surface side of the substrate 400 (the side of the substrate placement surface 310 of the case) and the substrate placement surface 310. Thus, the electrical insulation can be secured. In addition, the substrate 400 and the substrate placement surface 310 are disposed in proximity to each other as much as possible, so as to improve the thermal conductivity.

That is, since the electronic parts are mounted on the upper surface side of the substrate 400, a through hole may be formed in the lower surface side of the substrate 400, or a soldered terminal may be partially exposed from the lower surface side of the substrate 400, in some cases. (Besides, the upper surface side refers to a direction corresponding to the upper side in the drawings.)

In this connection, if the warpage of the substrate 400 is occurred due to the heat generation of the substrate 400, or due to load fluctuations caused by an external environment (for example, an acceleration or a deceleration of the automobile when the substrate 400 is mounted on the automobile) of the control unit using the substrate 400, or due to an aged deterioration, there is a possibility that the electrical insulation may be impaired by the unnecessary electrical contact being intended in advance when the lower surface side of the substrate 400 comes in a contact with the substrate placement surface 310. Accordingly, in the first configuration example of the present invention, the protruding portion 330 is formed on the substrate placement surface 310. The contact between the substrate 400 and the substrate placement surface 310 is minimally reduced by use of the protruding portion 330. Thus, the electrical insulation is to be secured by the protruding portion 330 preventing the occurrence of the unnecessary electrical contact between the substrate 400 and the substrate placement surface 310, which has not been intended in advance.

Consequently, with regard to the position to form the protruding portion 330, it is preferable to provide the protruding portion 330 at a position opposed to a position that is predicted as the center of a deformation due to the warpage of the substrate caused by, for example, the thermal deformation, that is, at a position where the substrate is predicted to come into the contact with the substrate placement surface 310 due to the warpage of the substrate, based on previous simulations or the like. However, depending on the methods of disposing or mounting the substrate, not the entire substrate 400 may be disposed on the substrate placement surface 310, and only a part of the substrate 400, particularly, only a power module with a large heat generation amount, may be disposed on the substrate placement surface 310. In such a case, the center of the warpage is not necessarily located on the substrate placement surface 310. Therefore, in such a case, the protruding portion 330 may be disposed, on the substrate placement surface 310, at or in the vicinity of a position opposed to a position at which the substrate 400 is predicted to be in contact with the substrate placement surface 310 due to a maximized warpage of the substrate 400 on the substrate placement surface 310, in the vicinity of a position opposed to a position that is predicted as the center of a deformation due to the warpage of the substrate 400.

Alternatively, the protruding portion 330 may be disposed at or in the vicinity of the geometric center of the substrate placement surface 310 if the predictions are difficult. The number of the protruding portions 330 is not limited to one, and the plural protruding portions 330 may be provided on the substrate placement surface 330 as needed. Thus, it is possible to provide the plural protruding portions 330 in the vicinity of the above-described position.

In addition, the height of the protruding portion 330 protruding from the substrate placement surface 310 can be equal to (the same as) or slightly lower than the height of the thermal interface material TIM disposed from the periphery of the protruding portion 330 on the substrate placement surface 310 from the substrate placement surface 310, as shown in FIG. 4A. Thus, as described above, when the height of the protruding portion 330 protruding from the substrate placement surface 310 is equal to the height of the TIM, it is possible to prevent the occurrence of the warpage of the substrate in advance. Meanwhile, when the protruding portion 330 is formed slightly lower than the above-described height, it is possible to reduce the accumulation of the distortion and the internal stress generated in the substrate to some extent, by allowing a small warpage amount.

Here, there is no particular limitation on the thermal interface material TIM. However, it is possible to adopt the thermal interface material TIM having the improved insulation characteristics, or possible to coat the substrate placement surface 310 with the TIM. Since the clearance between the substrate placement surface 310 and the substrate 400 is preferably in a range of 100 [μm] to 500 [μm], the TIM can be formed in the clearance therebetween. It is preferable to provide the TIM having a specification that an oil leak and the like are not occurred by an endurance test or the like. Further, the thermal interface material TIM is not provided on the upper surface side of the protruding portion 330 as described above, but is disposed on the substrate placement surface 310 from the periphery of the protruding portion 330. Therefore, the upper surface side of the protruding portion 330 directly contacts the lower surface side of the substrate 400, or comes into a direct contact with the substrate 400 when the warpage of the substrate 400 occurs.

In addition, there is no particular limitation on the shape of the protruding portion 330. The protruding portion 330 may have a trapezoidal or rectangular shape when viewed from the side, as its cross section is shown in FIGS. 4B and 4C. Alternatively, the protruding portion 330 may be formed in a mound shape (not shown). When the protruding portion 330 is formed of a conductor constituting the case body 300 as will be described below, it is possible to prevent the unnecessary electrical contact with the substrate 400 by covering the protruding portion 330 with the cap C made of a nonconductor as shown in FIGS. 4D and 4E, and by fixing the cap C by use of a calking means, an adhesive, or the like.

Further, the protruding portion 330 may be formed of the same material as the case 300, on the upper side of the substrate placement surface 310 when the case 300 is formed. Alternatively, the protruding portion 330 may be separately formed of the insulating material, and then disposed on the upper side of the substrate placement surface 310 after the case 300 is formed. However, as described above, when the protruding portion 330 is formed of the same material as the case 300, and the material of the substrate placement surface 310 part of the case 300 is a conductor, it is necessary to dispose an insulator section (a part where no wiring is formed) of the substrate 400 at the position opposed to the protruding portion 330 of the case 300, on a surface of the substrate 400 facing the substrate placement surface 310 side (the lower side of the substrate 400), so as to secure the insulation by preventing the unnecessary electrical contact with the substrate 400, which has not been intended in advance. Accordingly, in the case of such a disposition as described above, it is possible to most simply secure the insulation by preventing the unnecessary electrical contact between the substrate 400 and the substrate placement surface 310, which has not been intended in advance. Even in such a case, there is no basically problem as long as the insulation is secured for preventing the unnecessary electrical contact between the substrate 400 and the substrate placement surface 310. Thus, it is also possible to secure the insulation from the substrate 400 by covering the protruding portion 330 with the cap C made of the nonconductor as shown in FIGS. 4D and 4E, as described above, and by fixing the cap C by use of a calking means, an adhesive, or the like.

Next, the description will be provided about an example of the case cover 500 housing the substrate 400 mounted on the case body 300 of the present invention, which includes the substrate placement surface 310 having the protruding portion 330 formed thereon, as shown in FIG. 5. Here, FIG. 5 is a perspective view of the case body 300 according to the present invention, which houses, for example, the control unit of the electric power steering apparatus, and related elements, as described above. The case of the present invention includes the case body 300 and the case cover 500, as shown in FIG. 3, and is configured to allow the substrate 400 to be disposed or mounted on the substrate placement surface 310 of the case body 300.

Generally, the substrate 400 is a resin component constituted by the insulator on which the circuit pattern made of the conductor is formed. FIG. 5 shows an example of the substrate on which there are mounted both of the power module section (or the inverter section) with a large heat generation amount, which includes the inverter and so on, and a control section for controlling the above power module section. In addition, the substrate 400 is configured in such a manner that the power module section of the substrate 400 is disposed on the substrate placement surface 310 of the case body 300 via the thermal interface material TIM. The substrate 400 is attached to the case body 300 by screws 360. The same applies to substrates 800 and 900 according to second and third configuration examples of the present invention to be described below.

Further, a motor output terminal 600 and a connector section 700 are connected and fixed to the case 300 via a motor output terminal locking section 613 and the like, by screws 560 and 660, respectively. The motor output terminal 600 is connected to the power module section of the substrate. The connector section 700 is connected to the control section of the substrate and is connected to signal lines of various sensors and the like. After the substrate 400, the motor output terminal 600, and the connector section 700 are connected to the case body 300, the case cover 500 is caulked and fixed so as to cover the substrate 400 and the case body 300 from above.

Figure 6A:
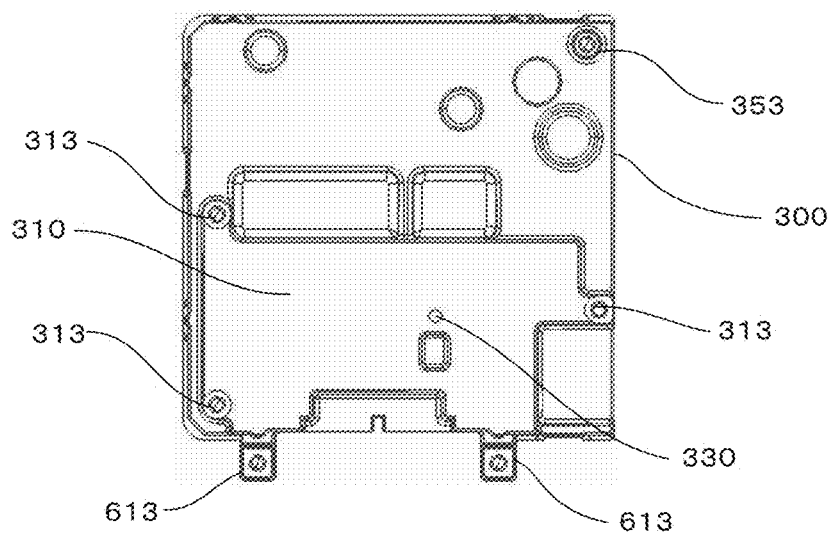
FIG. 6A is a top view of the case body according to the present invention.
Figure 6B:
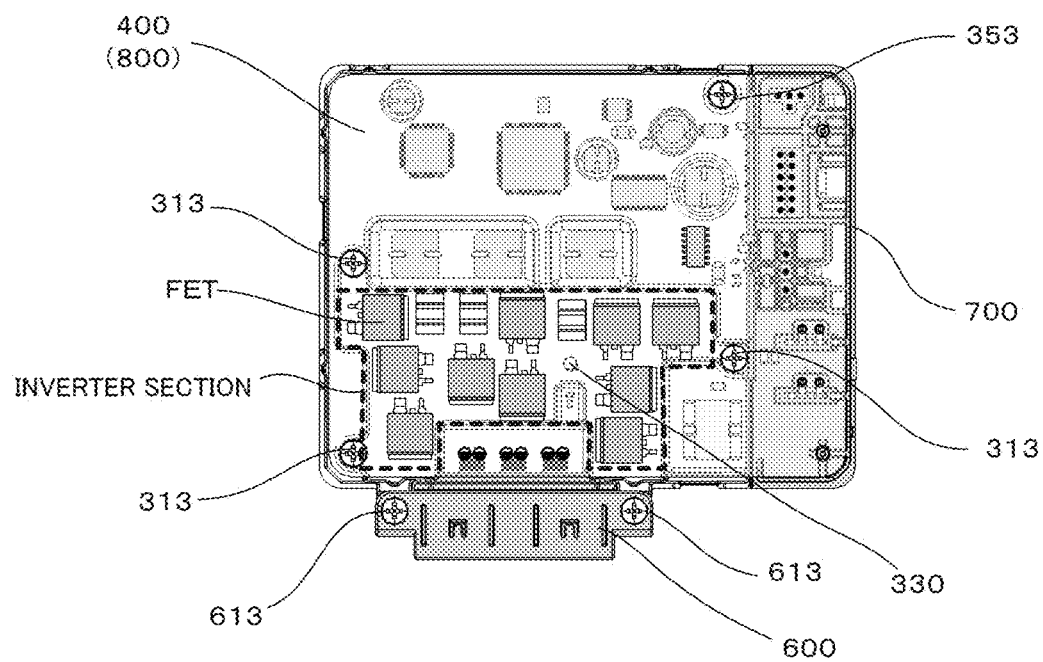
FIG. 6B is a top view of the substrate according to the first configuration example and the second configuration example of the present invention, which has been disposed on the case body according to the present invention, with a part of the substrate illustrated transparently.

FIG. 6A is a top view of the case body 300 according to the present invention, as shown in FIG. 3 or FIG. 5. FIG. 6B is a top view of the substrate 400 (or a substrate 800 to be described below), the motor output terminal 600, and the connector section 700, which have been disposed on the case body 300 according to the present invention, similarly as shown in FIG. 3 or FIG. 5, with a part of the substrate 400 illustrated transparently.

In the example of FIGS. 6A and 6B, the substrate 400 is divided into the inverter section (an area surrounded by a bold dotted line in FIG. 6B) and the other section including the control section, as described above. The substrate 400 is formed larger than the case body 300. The connector section 700 is disposed on a part of the lower surface side of the substrate 400.

In the substrate 400, the inverter section is disposed directly above the substrate placement surface 310 of the case body 300 via the thermal interface material TIM. In particular, a nonconductive section of the substrate 400, that is, a part of the substrate 400, which is made of the insulator is disposed at a position opposed to the protruding portion 330 formed on the substrate placement surface 310.

Accordingly, according to the above configuration, the substrate placement surface 310 of the case body 300 and the substrate 400 can be disposed in proximity to each other via the thermal interface material TIM. In this connection, the heat generated from the substrate 400 can be effectively radiated to the outside via the case body 300. In addition, a part of the substrate 400 opposed to the protruding portion 330 of the case body 300 is formed of the nonconductive section. Therefore, even if the substrate 400 comes into a contact with the substrate placement surface 310 due to the warpage caused by the heat or the like, as described above, it is possible to secure the electrical insulation very easily by preventing the unnecessary electrical contact, which has not been intended in advance.

As described above, according to the first configuration example of the present invention, the substrate 400 and the case 300 are disposed in proximity to each other as much as possible to improve the heat radiation. Even if the substrate 400 and the substrate placement surface 310 of the case 300 are brought into the contact with each other due to the warpage of the substrate 400 caused by the thermal deformation, an increase in a load arising from, for example, the acceleration, the aged deterioration or the like, the protruding portion 330 prevents the unnecessary electrical contact between the substrate 400 and the substrate placement surface 310. Thus, it is possible to provide a structure of the case for housing the substrate having the electronic parts mounted thereon, which can maintain the electrical insulation by preventing the unnecessary electrical contact between the substrate 400 and the substrate placement surface 310, and can also minimally reduce the contact therebetween, at the same time.

Next, another configuration example (the second configuration example) of the present invention will be described. The second configuration example of the present invention basically adopts a configuration in which a protruding portion formed on the substrate placement surface of the case is in contact with the electrical ground wiring section of the circuit pattern formed on the substrate.

Such a configuration in the second configuration example of the present invention achieves the following. While the substrate and the substrate placement surface of the case are disposed in proximity to each other as much as possible so as to improve the heat radiation, it is possible to prevent the occurrence of the warpage due to the thermal deformation, the aged deterioration or the like by causing the protruding portion to be in contact with the substrate. In addition, it is also possible to achieve the active conduction of the heat between the substrate and the substrate placement surface, and also possible to reduce the common impedance to achieve a reduction in noise by disposing the electrical ground wiring of the substrate and the case functioning as an electrical ground in proximity to each other.

Therefore, in the second configuration example of the present invention, the basic structure of the substrate having the electronic parts mounted thereon and the case for housing the substrate is similar to that of the first configuration example as described above. The case includes the case body, as shown in FIG. 3, and a case cover to be combined with the case body, as shown in FIG. 5. However, in the second configuration example of the present invention, the electronic circuit to be mounted on the substrate functions as the electrical ground while the substrate and the protruding portion are brought into the contact with each other. Thus, the substrate placement surface 310 of the case body is formed, in a planar manner, on the conductor section of the case body in accordance with the substrate 800 disposed in the case body 300.

Figure 7A:
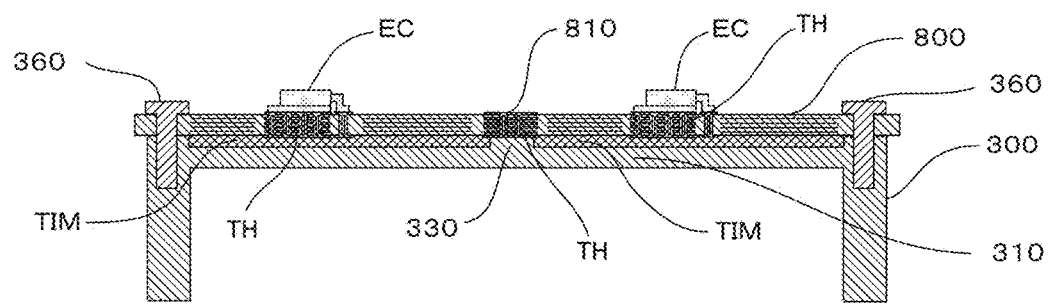
FIG. 7A is a sectional side view of the substrate disposed, via the thermal interface material, on the substrate placement surface of the case body according to the second configuration example of the present invention, taken along a line through a protruding portion provided on the substrate placement surface of the case.
Figure 7B:
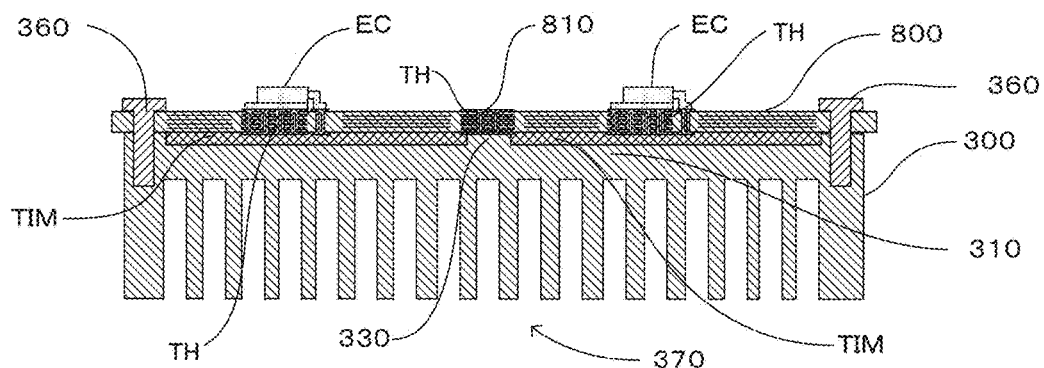
FIG. 7B shows an example of providing a heatsink on the lower side of the back surface of the substrate placement surface in a situation similar to FIG. 7A.

Further, as shown in FIG. 7A, the thermal interface material TIM having the high thermal conductivity is disposed between the substrate 800 and the substrate placement surface 310, in a similar manner to the first configuration example of the present invention as described above. FIG. 7A is a sectional side view of the substrate 800 disposed, via the thermal interface material TIM, on the substrate placement surface 310 of the case body 300 according to the present invention, taken along a line through the protruding portion 330 provided on the substrate placement surface 310 of the case 300. An example of arranging the electronic parts EC (for example, FETs) on the substrate 800 is exemplified here. In addition, FIG. 7B shows an example of providing a heatsink 370 on the lower side of the back surface of the substrate placement surface 310, in a similar situation. The heatsink 370 is formed in a comb shape, when viewed from the side, so as to enhance the heat radiation function. However, the heat radiation function is not limited to the one shown in the drawing, and any form is acceptable as long as the function can be achieved from the entire configuration including the case body 300.

The substrate 800 is disposed or mounted on the substrate placement surface 310 by use of locking sections 313, a substrate locking pillar 353 and the like, in a manner similar to the first configuration example of the present invention as described above with reference to FIG. 3.

In the second configuration example of the present invention, the protruding portion 330 is a protrusion formed, in a protruding shape, on the substrate placement surface 310, in such a manner that the protruding portion 330 comes into a contact with the electrical ground wiring section 810 of the circuit pattern formed on the substrate 800. The protruding portion 330 may be formed in, for example, a truncated cone shape with the substrate placement surface as a bottom surface, in a manner similar to the first configuration example of the present invention, as shown in FIG. 4B. Alternatively, the protruding portion 330 may be formed in a cylindrical shape with the substrate placement surface 310 as a bottom surface, as its cross section is shown in FIG. 4C. As well, in the second configuration example of the present invention, the protruding portion 330 of the substrate placement surface 310 is intentionally brought into the contact with the electrical wiring section of the circuit pattern formed on the substrate 800. Thus, unlike the examples as shown in FIGS. 4D and 4E, the cap C made of a nonconductor is not used.

Then, as well as the first configuration example of the present invention, the protruding portion 330 is disposed in the following manner. Even if the warpage of the substrate 800 occurs, the circuit pattern section formed on the back surface side (the substrate placement surface 310 side) of the substrate 800 does not come into a direct contact with the substrate placement surface 310 without involving the TIM, at any positions other than the protruding portion 330. Thus, it is possible to prevent the unnecessary electrical contact, which has not been intended in advance, so as to secure the electrical insulation. In addition, the substrate 800 and the substrate placement surface 310 are disposed in proximity to each other as much as possible. Therefore, the thermal conductivity can be improved.

In addition to forming the protruding portion 330 on the substrate placement surface 310, the height of the protruding portion 330 is defined in the second configuration example of the present invention, as follows. The height of the protruding portion 330 protruding from the substrate placement surface 310 is equal to the height, from the substrate placement surface 310, of the thermal interface material TIM disposed from the periphery of the protruding portion 330 on the substrate placement surface 310, as shown in FIG. 7A. In this connection, with such a configuration, it is possible to prevent the occurrence of the warpage of the substrate 800, and also to prevent a failure due to the warpage of the substrate 800 in advance. Further, by bringing the protruding portion 330 into the contact with the substrate 800 in advance as described above, the contact between the substrate 800 and the substrate placement surface 310 is minimally reduced, and the electrical insulation between the circuit pattern, formed on the substrate 800, and the substrate placement surface 310 is secured at any positions other than the protruding portion 330.

Therefore, as well as the first configuration example of the present invention, the protruding portion 330 is formed at, for example, a position opposed to a position that is predicted as the center of the deformation due to the warpage of the substrate caused by the thermal deformation or the like. Since the protruding portion 330 is provided for preventing the warpage of the substrate 800 in advance as described above, and for promoting the heat conduction, the electrical ground connection and the like, as will be described below, it is also possible to provide the plural protruding portions 330. In such a case, it is also possible to provide the plural electrical ground wiring sections 810 of the substrate 800 accordingly. Additionally, in the above case, it is also possible to separately provide an electrical ground wiring section 810C (not shown) corresponding to the circuit pattern of the control system, and the electrical ground wiring section 810P (not shown) corresponding to the circuit pattern of the power system.

Moreover, in the second configuration example of the present invention, the substrate 800 is basically housed in the case in a manner similar to the first configuration example shown in FIG. 5. However, in the second configuration example of the present invention, the circuit patterns made of the conductors are formed on the front surface side and the back surface side of the substrate 800. The protruding portion 330 is formed on the substrate placement surface 310 of the case body 300 in a manner where the protruding portion 330 comes into the contact with the part 810 corresponding to the electrical ground wiring of the circuit pattern on the substrate 800. Thus, it is possible to reduce the common impedance with the substrate 800 when the case 300 is used as the electrical ground.

That is, the case 300 can be used as the electrical ground for the circuit formed on the substrate 800. In the second configuration example of the present invention, the electrical ground wiring may be connected via, for example, the screwed section of the substrate 800 when the substrate 800 is fixed to the case 300, in a manner similar to the conventional method. However, instead of or in addition to the above method, the electrical ground wiring section 810 of the circuit pattern formed on the substrate 800, as described above, may be directly connected, by the protruding portion 330, to the case 300 functioning as the electrical ground. Thus, it is possible to reduce the common impedance.

The substrate 800 may be, for example, a multilayer substrate. In such a case, it is possible to provide a through hole through the multilayer substrate, from the front surface side to the back surface side, and connect thereto the electrical ground wiring section 810 of the circuit pattern formed on each phase of the multilayer substrate. Then, the protruding portion 330 of the case 300 is brought into the contact with an area of the above-described through hole including a land section on the back surface side of the substrate 800 as the electrical ground wiring section 810. Thus, it is possible to electrically connect the protruding portion 330 and the electrical ground wiring of the circuit pattern formed on the substrate 800.

Here, as described above, plural electrical ground wiring sections 810 may be provided on the substrate 800, separately as, for example, the part 810C functioning as the control circuit among the circuit patterns formed on the substrate 800, and the part 810P functioning as the circuit of the power module including the inverter and the like. Accordingly, it is also possible to provide the plural protruding portions 330 of the case 300.

Accordingly, with such a configuration, it is also possible to connect the electrical ground wiring on the substrate 800 and the case 300 functioning as the electrical ground for each functional section of the circuit pattern formed on the substrate 800. Thus, it is also possible to reduce, for example, unnecessary radiation noise to improve the EMC by further reducing the common impedance.

Furthermore, as described above, the electrical ground wiring section 810 on the substrate 800 and the protruding portion 330 on the case 300 are both made of the conductors, and also function as good conductors of the heat. Thus, it is also possible to actively conduct the heat generated from the substrate 800 at the contact section between the substrate 800 and the protruding portion 330 of the case. Accordingly, it is also possible to promote the heat radiation from the electronic parts EC mounted on the substrate 800 to the external space through the case 300.

Therefore, when the through hole is provided in the multilayer substrate to form the electrical ground wiring section 810, as described above, it is also possible to utilize the through hole as a heat radiation VIA.

In addition, as described with regard to the first configuration example of the present invention, the substrate 800 is attached to and integrated with the case 300 by use of the screws 360 rear screw holes 403 formed in the substrate 800 are aligned with screw holes formed in the upper ends of the locking sections 313 or the upper end of the substrate locking pillar 353 of the case body 300.

However, although the screw hole 403 formed in the substrate 800 is generally in a circular shape in accordance with the outer diameter of the screw 360, it is also possible to form the screw hole 403 in a shape which mitigates an increase in the internal stress due to the heat generated in the substrate 800.

Figure 8A:
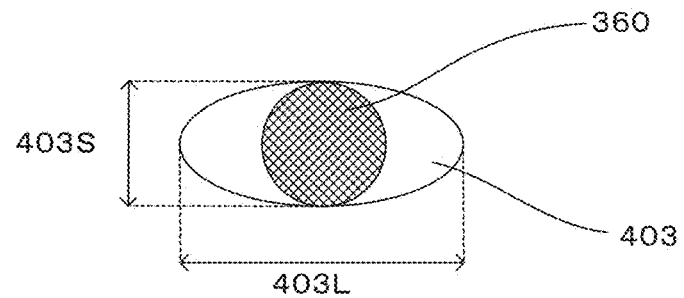
FIGS. 8A and 8B show the second configuration example of the present invention with the case body having the substrate disposed thereon.
Figure 8B:
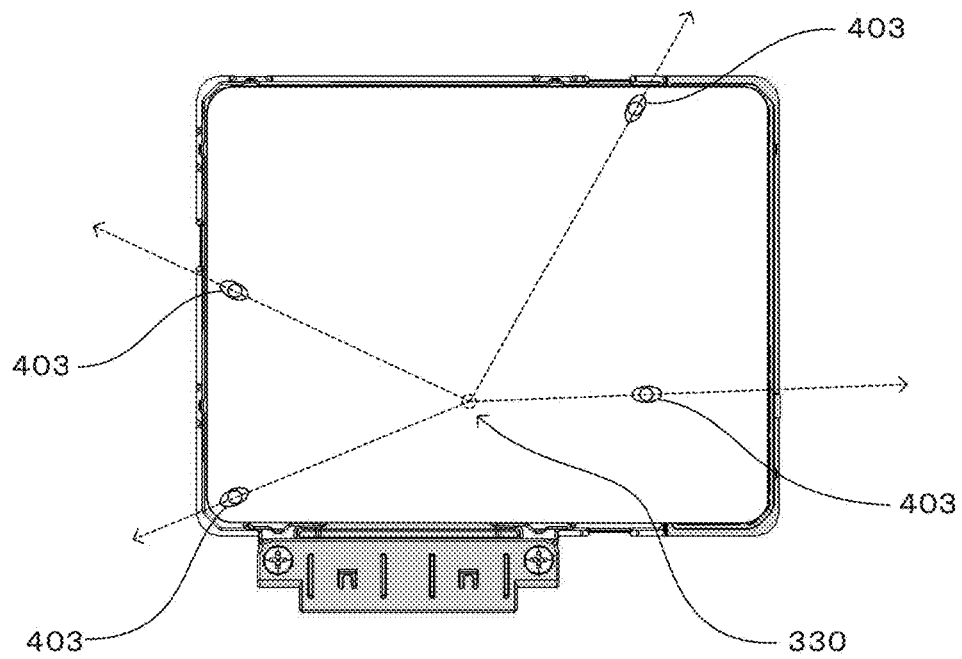

That is, as shown in FIG. 8A, it is also possible to form the screw hole 403 of the substrate 800, as follows. The screw hole 403 is formed in a substantially elliptical shape having, for example, a long axis 403L and a short axis 403S. The long axis 403L of the above-described elliptical shape is arranged in a radial direction from a position opposed to the protruding portion 330 of the substrate placement surface 310 (or the geometric center of the substrate 800), as represented as an arrow indicated by a dotted line in FIG. 8B. FIGS. 8A and 8B show the case body 300 having the substrate 800 disposed thereon. FIG. 8A is an enlarged top view of a cross section of the outer periphery of the screw 360 and the inner periphery of the screw hole 403 formed in the substrate 800. FIG. 8B is a top view showing an example of the entire substrate 800 with the screw holes 403 thereof in the elliptical shape. (The electronic parts EC and the like to be mounted are omitted here.)

Consequently, the formation of the screw holes 403 of the substrate 800 in the above-described shape can achieve the following. Even when the substrate 800 is deformed in the horizontal direction, due to the heat generation of the electronic parts EC mounted on the substrate 800, the aged deterioration of the substrate 800 or the like, beyond the extent of, for example, a warpage prevention effect by the protruding portion 330, the substrate 800 can be deformed along the inner side of the screw hole 403 on the outer peripheral side of the screw 360. Thus, it is possible to prevent a plastic fracture of the substrate 800 even if the internal stress of the substrate 800 increases.

As well, the shape of the screw hole 403 formed as described above is not necessarily limited to the ellipse shape. The screw hole 403 may be formed in a rhombic shape, and the screw 360 may be screwed into the geometric center thereof. In addition, the long axis 403L is not necessarily along the radial direction from, for example, the position opposed to the protruding portion 330 of the substrate placement surface 310. For example, when the plural protruding portions 330 is provided on the substrate placement surface 310, the plural protruding portions 330 may be formed in a radial direction from the geometric center of a form formed by an envelope of positions opposed to the plural protruding portions 330.

Returning to FIG. 5, the description will be continued. As described in the first configuration example of the present invention, the case 300 further includes a motor output terminal 600 and a connector section 700. The motor output terminal 600 is connected to a functional section as the power module of the substrate 800. The connector section 700 is connected to a functional section as a control section of the substrate 800 and is connected to signal lines of various sensors and the like. The motor output terminal 600 and the connector section 700 are connected and fixed to the case 300, via the motor output terminal locking section 613 and the like, by the screws 660 and 760, respectively. Rear the substrate 800, the motor output terminal 600, and the connector section 700 are connected to the case body 300, the cover 500 of the case 300 is caulked and fixed so as to cover the substrate 800 and the case body 300 from above. Rear the elements are integrated as described above, the case 300 is mounted on, for example, the electric motor 20 and a chassis outside the case 300. The conductor section of the case 300 is electrically connected to the conductor section of the external chassis and the like, as the electrical ground.

Also in the second configuration example of the present invention, the power module section of the substrate 800 including the inverter and the like is disposed directly above the substrate placement surface 310 of the case body 300 via the thermal interface material TIM. In particular, at the position opposed to the protruding portion 330 formed on the substrate placement surface 310, there is disposed the electrical ground wiring section 810 of the substrate 800 as shown in FIGS. 7A and 7B, that is, the part 810 of the circuit pattern formed on the substrate 800, where the electrical ground wiring is formed.

Therefore, according to the second configuration example of the present invention, the substrate placement surface 310 of the case body 300 and the substrate 800 can be disposed in proximity to each other via the thermal interface material TIM. Thus, it is possible to effectively radiate the heat generated from the substrate 800 to the outside through the case body 300. In addition, the protruding portion 330 is provided on the substrate placement surface 310 of the case body 300 in a manner where the protruding portion 330 is brought into the contact with the substrate 800 in advance. Accordingly, it is possible to prevent, in advance, the substrate 800 from coming into the contact with the substrate placement surface 310 due to the warpage of the substrate 800 caused by the heat or the like, as described above.

Furthermore, since the electrical ground wiring section 810 of the circuit pattern formed on the substrate 800 is in contact with the protruding portion 330 of the case body 300, it is possible to reduce the common impedance of the substrate 800, as described above. In addition, it is also possible to efficiently conduct the heat generated from the electronic parts EC, such as the FETs mounted on the substrate 800, to the case 300 and release the heat to the external space.

Therefore, according to the second configuration example of the present invention, it is possible to provide the structure of the substrate having the electronic parts mounted thereon and the case for housing the substrate, which achieves the following. The substrate 800 and the substrate placement surface 310 of the case 300 are disposed in proximity to each other via the thermal interface material TIM. In addition, the protruding portion 330 protruding from the substrate placement surface 310 is brought into the contact with the electrical ground wiring section of the circuit pattern formed on the substrate 800. Thus, it is possible to prevent in advance the deformation of the substrate 800, such as the warpage due to the heat generation or the like, and also possible to achieve the active conduction of the heat between the substrate 800 and the substrate placement surface 310. Further, the electrical ground wiring of the circuit pattern formed on the substrate 800 and the case 300 functioning as the electrical ground are disposed in proximity to each other. As a result, it is also possible to reduce the noise by reducing the common impedance of the substrate 800.

Therefore, when the above-described structure of the substrate having the electronic parts mounted thereon and the case for housing the substrate is used for the control unit for, for example, the electric power steering apparatus, it is possible to further improve its performance by, for example, improving the measures for the EMC and reducing the noise.

Next, a still another configuration example (the third configuration example) of the present invention will be described. In the third configuration example of the present invention, a protruding portion having a truncated cone shape is formed on the substrate placement surface of the case according to the first and second configuration examples of the present invention, as described above. In addition, the substrate is provided with a hole portion at a position opposed to the protruding portion on the substrate placement surface when the substrate is disposed on the substrate placement surface of the case. The upper base of the truncated cone-shaped protruding portion enters the hole portion without coming into the contact with the substrate.

In the third configuration example of the present invention, which adopts such a configuration, an opening of the hole portion formed in the substrate comes into the contact with the inclined surface of the truncated cone-shaped protruding portion when the deformation of the substrate occurs. Thus, it is possible to deal with the distortion of the substrate and limit the distortion within a certain range, not only when the substrate is distorted in a direction perpendicular to a plane constituting the substrate, that is, the deformation due to the warpage occurs in the vertical direction, but also when the distortion in a direction horizontal to the plane constituting the substrate occurs along with the distortion in the vertical direction. Further, when a tapered surface or the like parallel to the above-described inclined surface of the truncated cone shape is provided at the opening on the back surface side of the hole portion of the substrate, it is possible to further expand the allowable extent of the warpage and the distortion. In addition, it is also possible to mitigate the stress on the contact surface between the substrate and the protruding portion by smoothing the contact surface therebetween.

In this connection, in the third configuration example of the present invention, the basic configuration of, for example, the case body 300 and the case cover 500 combined with the case body 300 is similar to those of the first and second configuration examples of the present invention as described above with reference to FIGS. 3 and 5. However, the protruding portion 330 is formed on the substrate placement surface 310 of the case body 300 in the truncated cone shape, that is, a trapezoidal shape when viewed from the side, as shown in FIGS. 9A and 9B.

Figure 10A:
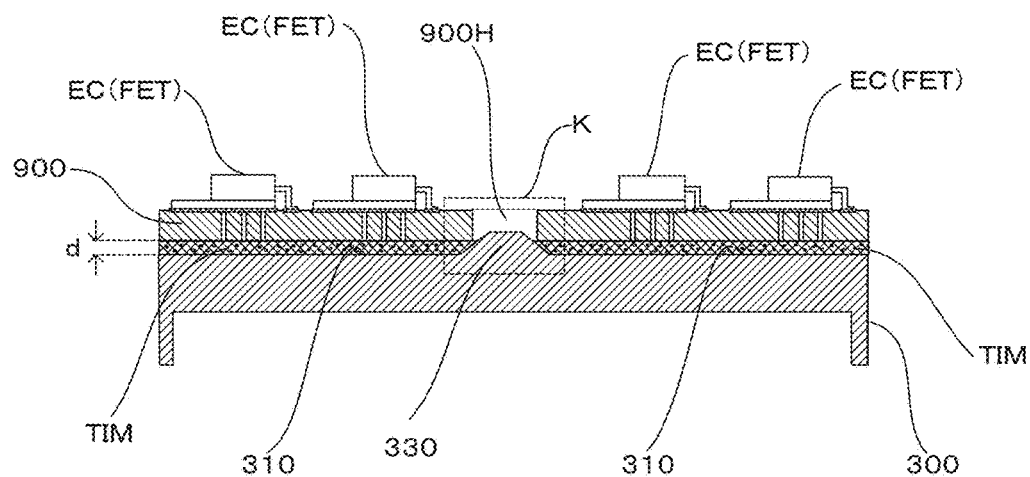
FIG. 10A is a sectional side view of the substrate disposed, via the thermal interface material, on the substrate placement surface of the case body according to the third configuration example of the present invention, taken along a line through the protruding portion provided on the substrate placement surface of the case.
Figure 10B:
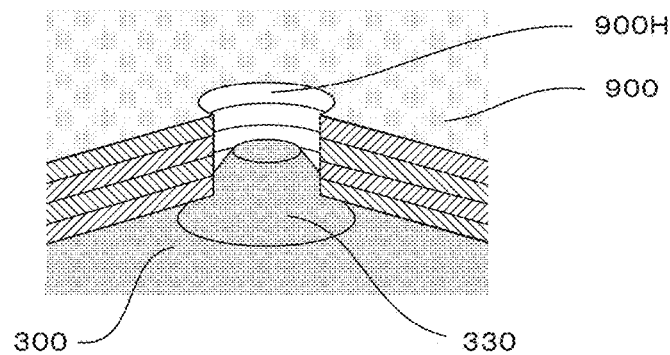
FIG. 10B is a perspective view partially including a half-sectional perspective view of an area around a part indicated as "K" in FIG. 10A.
Figure 10C:
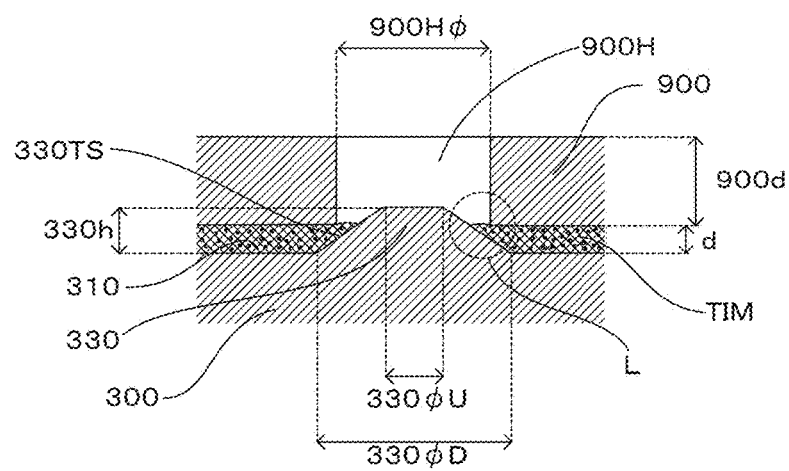
FIG. 10C is an enlarged sectional side view of an area of the section indicated as "K" in FIG. 10A.

As well as the first and second configuration examples of the present invention, the substrate placement surface 310 is formed in a planar manner in accordance with the substrate 900 to be disposed on the case body 300. In addition, the thermal interface material TIM having the high thermal conductivity is disposed between the substrate 900 and the substrate placement surface 310. In the third configuration example of the present invention, as shown in FIGS. 10A to 10C, the truncated cone-shaped protruding portion 330 is formed on the substrate placement surface 310 in a manner where the protruding portion 330 can enter the hole portion 900H formed in the substrate 900, without coming into the contact with the substrate 900. Here, FIG. 10A is a sectional side view of the substrate 900 disposed on the substrate placement surface 310 of the case body 300 according to the third configuration example of the present invention via the thermal interface material TIM, taken along a line through the protruding portion 330 provided on the substrate placement surface 310 of the case body 300. In the example exemplified here, the FETs are arranged as the electronic parts EC on the substrate 900. In addition, the heat radiations VIA are formed on the substrate 900 at respective positions below parts of the FETs corresponding to the heat spreaders, at equal intervals. Further, FIG. 10B is a perspective view partially including a partial sectional perspective view of an area around a frame "K" indicated by a chain line in FIG. 10A (the TIM is omitted here). As well as the above, FIG. 10C is an enlarged sectional side view of an area within the frame "K" indicated by the chain line in FIG. 10A.

Figure 11:
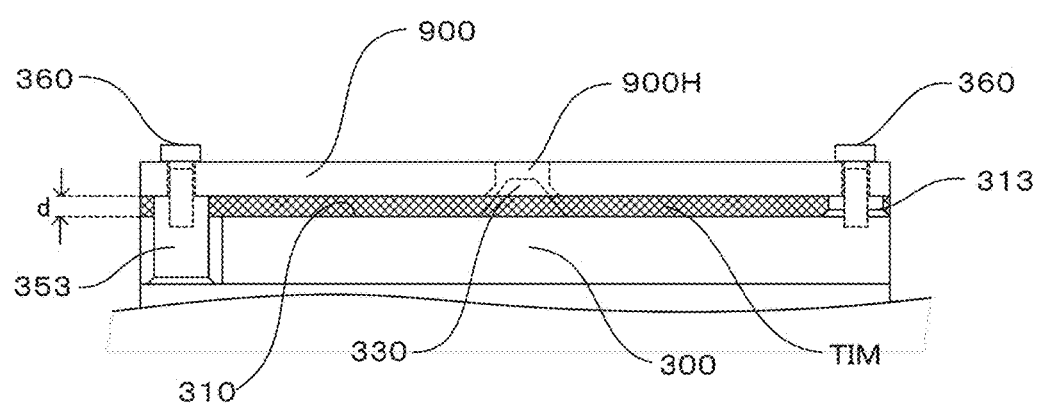
FIG. 11 is a schematic view showing an example of the substrate mounted on the case according to the third configuration example of the present invention.

Furthermore, basically, the substrate 900 is disposed or mounted on the substrate placement surface 310 in a manner similar to the first and second configuration examples of the present invention. For example, when viewed from the substrate placement surface 310 with the substrate 900 mounted on the case body 300, as shown in FIG. 11, the heights of the upper ends of plural locking sections 313, which project from the substrate placement surface 310 for mounting the substrate 900, and the height of the upper end of a substrate locking pillar 353 disposed on the periphery of the substrate placement surface 310 of the case body 300 are equal to a height "d" which allows the thermal interface material TIM to be uniformly arranged between the upper surface of the substrate placement surface 310 and the back surface of the substrate 900. Therefore, the height "d" of the back surface of the substrate 900 from the substrate placement surface 310 is substantially equal to (substantially the same as) the height (that is, the thickness of the TIM) of the thermal interface material TIM from the substrate placement surface 310. Therefore, as shown in FIG. 10A, the substrate 900 and the substrate placement surface 310 are disposed in close contact with each other, via the thermal interface material TIM. Here, FIG. 11 is a schematic view showing an example of the substrate 900 mounted on the case 300 when viewed from the right rear side to the left front side of the case 300 as shown in FIG. 3. The lower part of the case 300 is omitted here.

Figure 9A:
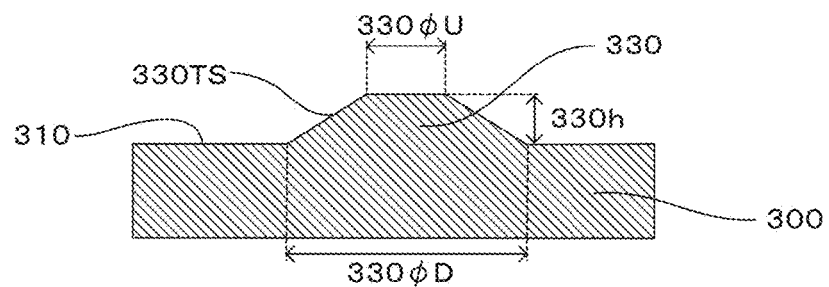
FIGS. 9A and 9B are sectional side views of the protruding portion according to the third configuration example of the present invention.
Figure 9B:
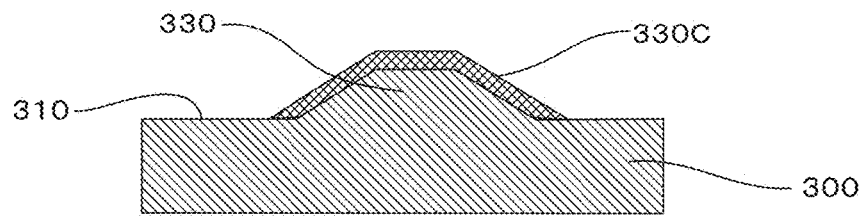

Next, the protruding portion 330 is a protrusion formed in the truncated cone shape on the substrate placement surface 310, as shown in the sectional view of FIG. 9A. The protruding portion 330 minimally reduces the contact between the substrate 900 and the substrate placement surface 310 due to the warpage of the substrate 900 so as to prevent the unnecessary electrical contact between the substrate 900 and the substrate placement surface 310, which has not been intended in advance. Thus, the electrical insulation can be secured.

In other words, since the electronic parts are mounted on the upper surface side of the substrate used in the present invention as shown in FIGS. 5 and 10, a through hole may be formed in the lower surface side of the substrate, or a soldered terminal may be partially exposed from the lower surface side of the substrate in some cases, as already shown in the first or second configuration example of the present invention.

Therefore, there is a possibility that the electrical insulation may be impaired due to the contact at the undesired position when the lower surface side (the back surface side) of the substrate 900 comes in the contact with the substrate placement surface 310 based on the warpage of the substrate 900 due to, for example, the heat generation of the substrate 900, the operating state or the external environment of the control unit using the substrate 900, or the aged deterioration. That is, when the substrate is mounted on, for example, the electric power steering apparatus of the automobile, a current close to or exceeding 120[A] may temporarily flow through the inverter circuit in the electric power steering apparatus, depending on a steering state such as an end hitting. The influence of various vibrations transmitted from the vehicle body and fluctuations in, for example, the heat and the humidity is also significant. Thus, when the warpage of the substrate occurs due to the influence of the operating conditions and the external environment, or the accumulation of the influence over the years, there is a possibility that the electrical insulation may be impaired due to the unnecessary electrical contact which has not been intended in advance, based on the lower surface side (the back surface side) of the substrate 900 coming into the contact with the substrate placement surface 310.

In this connection, in the third configuration example according to the present invention, the truncated cone-shaped protruding portion 330 is formed on the substrate placement surface 310. When the warpage of the substrate 900 occurs, a part of the substrate 900 is brought into the contact with the inclined surface 330TS formed on the truncated cone-shaped protruding portion 330, as will be described below. Thus, it is possible to minimally reduce the contact between the substrate 900 and the substrate placement surface 310 by suppressing the expansion of the warpage of the substrate 900. As a result, the electrical insulation is to be secured by the protruding portion 330 preventing the unnecessary electrical contact between the substrate 900 and the substrate placement surface 310 which has not been intended in advance.

Figure 12A:
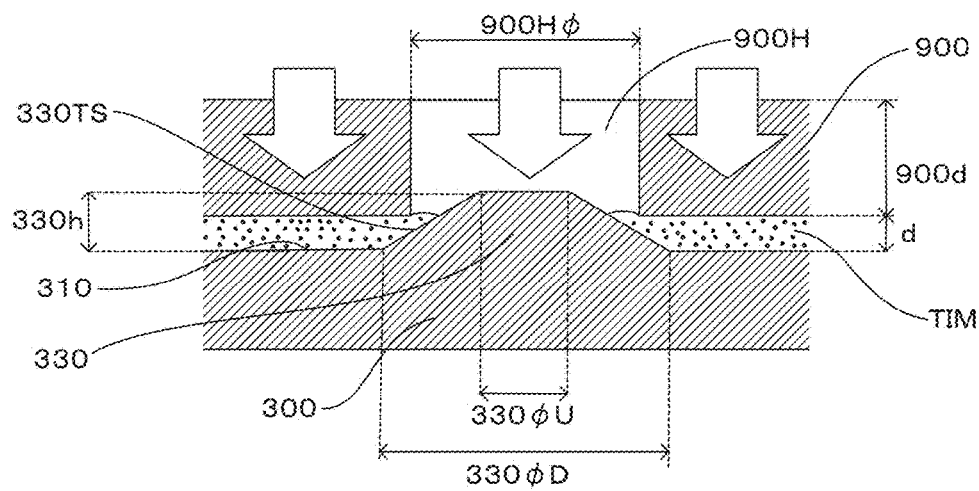
FIGS. 12A and 12B are sectional side views of the substrate around the protruding portion according to the third configuration example of the present invention, before and after an occurrence of the warpage of the substrate.
Figure 12B:
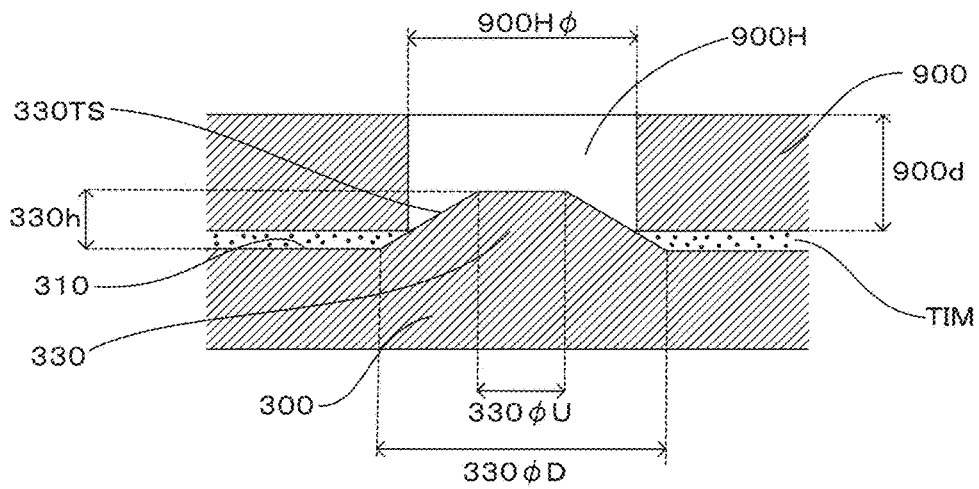

States before and after an occurrence of the warpage of the substrate 900 around the protruding portion 330 are shown in FIGS. 12A and 12B. That is, for example, the truncated cone-shaped protruding portion 330 and the hole portion 900H formed in the substrate 900 normally have a gap therebetween, and are not in contact with each other, as shown in FIG. 12A. However, when the action causing the warpage is applied to the substrate 900 due to the thermal deformation or the like, as indicated by white arrows in FIG. 12A, the warpage occurs based on the substrate 900 bending toward the substrate placement surface 310 of the case 300 located below, as shown in FIG. 12B. Based on the occurrence of the warpage, the opening of the hole portion 900H on the back surface side of the substrate 900 comes into the contact with the inclined surface 330TS of the truncated cone constituting the protruding portion 330. In the third configuration example according to the present invention, the further expansion of the warpage of the substrate 900 can be suppressed by the contact. Thus, the electrical insulation can be secured by the protruding portion 330 preventing the unnecessary electrical contact between the substrate 900 and the substrate placement surface 310 which has not been intended in advance.

The truncated cone-shaped protruding portion 330 will be described in further detail. As shown in FIG. 9B described above, the protruding portion 330 is formed in the truncated cone shape with the substrate placement surface 310 as a bottom surface. In the third configuration example according to the present invention, the respective elements of the truncated cone shape, that is, the diameter of a circle constituting the upper base, the diameter of a circle constituting the lower base, and the height are represented as 330φU, 330φD and 330h in the drawings, respectively. The size of each element of the truncated cone shape is associated with, for example, the size of the hole portion 900H provided in the substrate 900, as will be described below with reference to, for example, FIGS. 10A to 10C. When the case body 300 is combined with the substrate 900, the hole portion 900H is formed in the substrate 900 in a manner to allow the upper base of the truncated cone shape forming the protruding portions 330 to enter the hole portion 900H without coming into the contact with the substrate 900, in the initial state of the substrate 900 with no warpage. Therefore, when the substrate 900 is deformed in the vertical and horizontal directions due to the warpage or the like, the opening on the back surface side of the hole portion 900H of the substrate 900 is brought into the contact with the inclined surface 330TS of the truncated cone shape. Thus, it is possible to suppress the expansion of the deformation in the vertical and horizontal directions due to the warpage or the like.

As well as the first or second configuration example of the present invention, the protruding portion 330 may be formed of the same material as that of the case body 300, on the upper side of the substrate placement surface 310 when the case body 300 is formed. Alternatively, the protruding portion 330 may be separately formed of the insulating material, and disposed on the upper side of the substrate placement surface 310 rear the case body 300 is formed. However, when the protruding portion 330 is formed of the same material as that of the case body 300, as described above, it is necessary that the opening of the hole portion 900H on the back surface side of the substrate 900, which comes into the contact with the inclined surface 330TS of the truncated cone shape forming the protruding portion 330 of the case body 300, is constituted by the insulator section of the substrate 900 if the case body 300 is formed of the conductor, so as to secure the insulation by preventing the unnecessary electrical contact between the substrate 900 and the substrate placement surface 310, which has not been intended in advance. Therefore, with the disposition and the configuration as described above, it is possible to most simply secure the insulation between the substrate 900 and the substrate placement surface 310.

As well, there is basically no problem as long as the electrical insulation is secured between the substrate 900 and the substrate placement surface 310 even if the substrate placement surface 310 is formed of the conductor as well as the case body 300, as described above. For example, as shown in FIG. 9B, it is also possible to secure the insulation from the substrate 900 by coating at least the inclined surface 330TS of the truncated cone shape of the protruding portion 330 with an insulating material 330C.

Further, as well as the first or second configuration examples of the present invention, it is possible to provide one or the plural truncated cone-shaped protruding portions 330, at or in the vicinity of, for example, a position opposed to a position that is predicted as the center of the deformation due to the warpage of the substrate 900 caused by, for example, the thermal deformation, based on simulations or the like.

Furthermore, the basic configuration of the case body 300 according to the present configuration example is as follows. The substrate 900 is mounted on the case body 300 of the present invention. The case body 300 has the substrate placement surface 310 with the truncated cone-shaped protruding portion 330 formed thereon. The case body 300 having the substrate 900 mounted thereon is housed in the case cover 500. The basic configuration is also similar to that of the first or second configuration example of the present invention, as shown in FIG. 5. The thermal interface material TIM disposed between the substrate placement surface 310 and the substrate 900 may be disposed on the substrate placement surface 310 from the periphery of the truncated cone-shaped protruding portion 330, as described above. Alternatively, the thermal interface material TIM may also be disposed to cover the inclined surface 330TS of the truncated cone shape forming the protruding portion, or to fully cover the truncated cone shape including the upper base (the upper surface).

Figure 14:
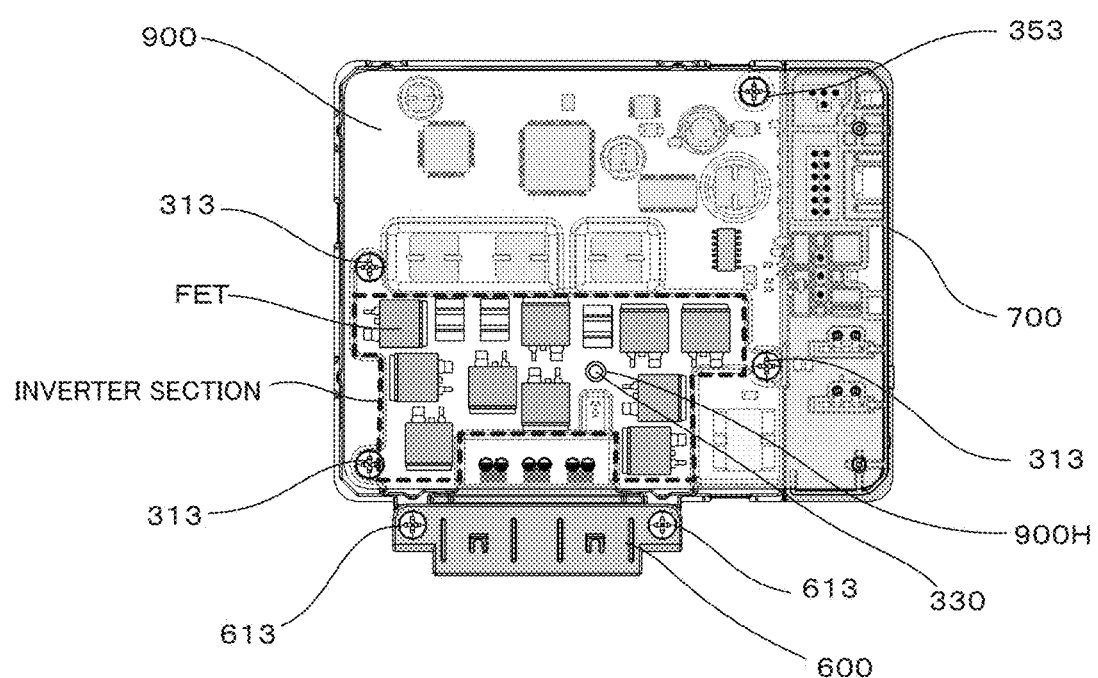
FIG. 14 is a top view of the substrate according to the third configuration example of the present invention, which has been disposed on the case body according to the present invention, with a part of the substrate illustrated transparently.

Next, the basic configuration of the substrate 900 is similar even in the third configuration example according to the present invention. Meanwhile, in the third configuration example according to the present invention, as shown in FIG. 14 to be described below, the substrate 900 is further provided with the hole portion 900H at a position to be opposed to the protruding portion 330 on the substrate placement surface 310 when the substrate 900 is mounted on and fixed to the substrate placement surface 310 of the case body 300, as shown in FIG. 10A described above.

In the third configuration example of the present invention shown in FIG. 10A, the hole portion 400H is a hole with an inner diameter of 900Hφ, as shown in FIG. 10C, which is formed to penetrate through the substrate 900 from the front surface (the upper side in FIGS. 10A to 10C) to the back surface (the side of the substrate 900 facing the substrate placement surface 310). As shown in, for example, the perspective view of FIG. 10B, the upper base of the truncated cone-shaped protruding portion 330 formed on the case 300 enters the hole portion 900H without coming into the contact with the substrate 900.

The above will be further described with reference to FIG. 10C. In the third configuration example of the present invention, as described above, the protruding portion 330 formed on the substrate placement surface 310 of the case body 300 is in a truncated cone shape having a circular upper base with a diameter of 330φU, a circular lower base with a diameter of 330φD, and a height of 330h. The inner diameter 900Hφ of the hole portion 900H of the substrate 900 is larger than the diameter 330φU of the circular upper base of the truncated cone-shaped protruding portion 330, and smaller than the diameter 330φD of the circular lower base thereof. The height 330h of the truncated cone-shaped protruding portion 330 is larger than the distance "d" between the substrate placement surface 310 of the case body 300 and the substrate 900.

Therefore, the above state can be written as "330φU<900Hφ<330φD", and "d<330h".

Therefore, the configuration achieves the following. The upper base part of the truncated cone-shaped protruding portion 330 enters inside the hole portion 900H of the substrate 900, that is, in a direction toward the front surface side of the substrate 900 rather than the back surface side of the substrate 900. The opening of the hole portion 900H on the back surface side of the substrate 900 is disposed above the inclined surface 330TS of the truncated cone-shaped protruding portion 330.

Therefore, according to the present invention, even when the substrate 900 deforms due to the warpage in a downward direction of the substrate 900 caused by the thermal deformation or the like, a further warpage is prevented since the opening of the hole portion 900H on the back surface side of the substrate 900 comes into the contact with the inclined surface 330TS of the truncated cone-shaped protruding portion 330. Thus, it is possible to suppress the expansion of the warpage.

In the above-described example, it is possible to set the ratios of the diameter 330φU of the circle constituting the upper base of the truncated cone shape to the inner diameter 900Hφ, and the diameter 330φD of the circle constituting the lower base to the truncated cone shape to the inner diameter 900Hφ to any values. In addition, it is also possible to set the above diameters and the height 330h to any values. Thus, with these combinations, it is possible to arbitrarily adjust, for example, the extent of the warpage capable of being controlled.

Figure 13A:
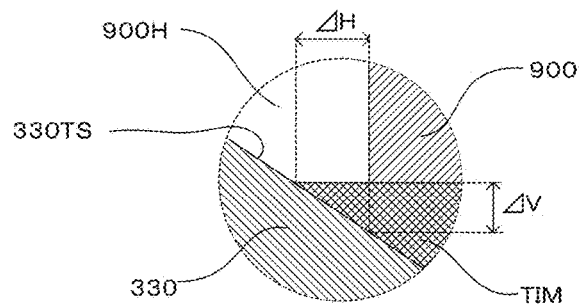
FIG. 13A is an enlarged view of an area indicated as "L" in the sectional view of FIG. 10C, FIGS. 13B to 13E are sectional side views showing other examples of the protruding portion and a hole portion.

Furthermore, in the third configuration example of the present invention, it is also possible to suppress a horizontal distortion of the substrate 900 to a certain limit while allowing the distortion, as shown in, for example, FIG. 13A. Here, FIG. 13A is an enlarged view of an area indicated as "L" in the sectional view of FIG. 10C.

That is, in FIG. 13A, "ΔH" is the length of a line drawn horizontally from the inner surface of the opening of the hole portion 900H on the back surface side of the substrate 900 to the inclined surface 330TS of the truncated cone-shaped protruding portion 330 (that is, an allowable range of a distortion in the horizontal direction). Similarly, "ΔV" is the length of a vertical line drawn, at the opening of the hole portion 900H on the back surface side of the substrate 900, from the back surface of the substrate 900 to the inclined surface 330TS of the truncated cone-shaped protruding portion 330 (that is, an allowable range of the warpage). In the third configuration example of the present invention, the expansion of a deformation due to the distortion of the substrate 900 is prevented by the opening of the hole portion 900H of the substrate 900 coming into the contact with the inclined surface 330TS of the protruding portion 330, as described above. When the warpage occurs in a direction perpendicular to the substrate 900, the warpage is allowed within a range of ΔV. In addition, for example, even when a distortion in the horizontal direction occurs due to a distortion in the vertical direction, the above-described inclined surface 330TS can deal with the distortion within a range of ΔH described above. Therefore, in the third configuration example of the present invention, it is possible to suppress the horizontal distortion of the substrate 900 to a certain limit while allowing the distortion, as described above.

Figure 13B:
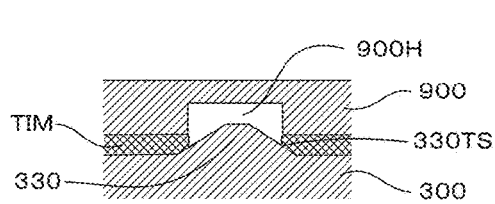
FIG. 13F shows, in a manner similar to FIG. 13A, an example of forming a tapered surface parallel to the inclined surface of the protruding portion at an opening of the substrate, together with expressions of allowable amounts of the warpage and a distortion ($\Delta V$ and $\Delta H$) to be increased by the tapered surface provided.
Figure 13C:
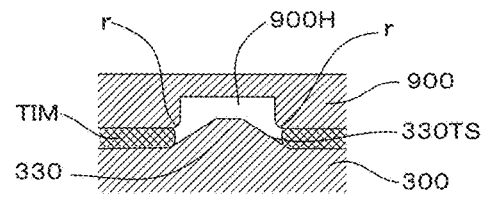

As well, the hole portion 900H formed in the substrate 900 is not necessarily limited to the one penetrating the substrate 900 from the front surface to the back surface of the substrate 900. As shown in FIGS. 13B and 13C, the hole portion 900H may also be formed partway in the substrate 900 from the back surface in a manner where the hole portion 900H does not penetrate through the substrate 900 to the front surface. With such a configuration, it is possible to prevent the expansion of the warpage and the like by using the inclined surface 330TS of the truncated cone-shaped protruding portion 330.

Figure 13D:
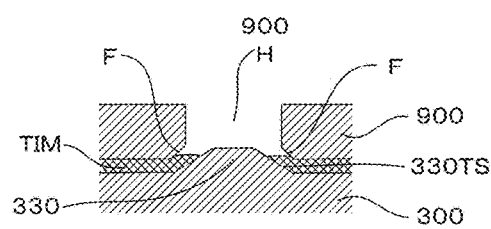
Figure 13E:
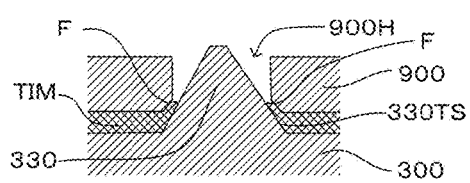

Further, it is possible to adopt a configuration which increases a substantial distance (an allowable range of the scale of the warpage and the like) from the inclined surface 330TS of the protruding portion 330, and also enables smooth contact and the like, by providing a curvature "r" or forming an inclined surface F at the opening of the hole portion 900H on the back surface side of the substrate, as shown in FIGS. 13C to 13E.

Figure 13F:
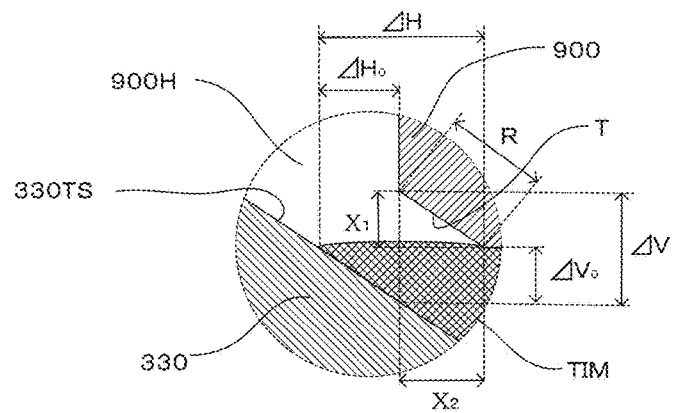

In this connection, for example, it is also possible to adopt the following configuration. A tapered surface T parallel to the inclined surface 330TS of the truncated cone shape is provided at the opening on the back surface side of the hole portion 900H of the substrate 900, which comes into the contact with the inclined surface 330TS of the truncated cone shape forming the protruding portion 330 of the case 300, as shown in FIG. 13F. Here, as well as FIG. 13A, FIG. 13F shows an example of forming the tapered surface T parallel to the inclined surface 330TS of the protruding portion 330, at the opening of the hole portion 900H formed in the substrate. FIG. 13F also includes expressions of allowable amounts of the warpage and the distortion (ΔV and ΔH) increased by the tapered surface T provided as described above. Here, the tapered surface T is not limited to a surface which is exactly parallel to the inclined surface 330TS of the truncated cone shape. There is no problem as long as the tapered surface T is substantially parallel to the inclined surface 330TS.

Then, with the above-described configuration, it is possible to expand the allowable range (ΔV) of the warpage and the allowable range (ΔH) of the distortion in the horizontal direction, as described above, without changing the distance between the substrate placement surface 310 and the back surface of the substrate 900. In other words, it is possible to achieve the above configuration when adopting the configuration of the tapered surface T having an inclination angle equal to that of the inclined surface 330TS of the truncated cone-shaped protruding portion, which is formed in a manner where the inner diameter gradually decreases from the outer edge of the opening of the hole portion 900H of the substrate 900 toward the inside of the hole portion 900H formed in the substrate 900.

More specifically, when the length of the tapered surface in the thickness direction of the substrate 900 is defined as $X_1$, the length in a direction along the substrate surface is defined as $X_2$, the width of the tapered surface from the opening is defined as R, and the allowable range of the warpage prior to the tapered surface being provided is defined as $\Delta V_0$, as shown in FIG. 13F, the allowable range (ΔV) of the warpage can be expanded as represented by the following expression.

$$\Delta V = \Delta V_0 + \sqrt{R^2 - X_2^2} = \Delta V_0 + X_1$$

Further, with regard to the allowable range (ΔH) of the distortion in the horizontal direction, when the allowable range prior to the tapered surface being provided is defined as $\Delta H_0$, the allowable range (ΔH) is expanded as represented by the following expression.

$$\Delta H = \Delta H_0 + \sqrt{R^2 - X_1^2} = \Delta H_0 + X_2$$

Furthermore, when the inclined surface of the protruding portion 330 and the tapered surface T are brought into the contact with each other, the surface contact is established between the two surfaces. Thus, in comparison with the case of none of the tapered surface T and the like being provided, a load on the contact area can be dispersed.

Therefore, according to the above configuration, it is possible to expand the allowable range (ΔV) of the warpage and the allowable range (ΔH) of the distortion in the horizontal direction without, for example, increasing the distance between the substrate 900 and the case body 300. In addition, it is possible to more effectively prevent the substrate 900 and the protruding portion 330 from, for example, being damaged when the contact therebetween occurs due to the warpage, by preventing the stress from concentrating on a specific part (edge) of the substrate 900 and the protruding portion 330.

The truncated cone-shaped protruding portion 330 may be formed in the following manner so that the upper base of the truncated cone-shaped protruding portion 330 is disposed within a range of a thickness 900d of the substrate 900. The height 330h of the truncated cone-shaped protruding portion 330 is larger than the distance "d" from the substrate placement surface 310 to the back surface of the substrate 900 when the substrate 900 is fixed to the substrate placement surface 310, as described above. In addition, the height 330h is less than a length obtained by the addition of the thickness 900d of the substrate 900 to the distance "d" to the back surface of the substrate 900. However, the formation of the truncated cone-shaped protruding portion 330 is not limited to the above. For example, it is also possible to form the truncated cone-shaped protruding portion 330 with a height larger than the above, if necessary, in a manner where the truncated cone-shaped protruding portion 330 is taller than the front surface of the substrate 900, as shown in FIG. 13E.

Therefore, it is also possible to change the angle of the inclined surface 330TS of the truncated cone-shaped protruding portion 330 by adjusting parameters such as the inner diameter 900Hφ of the hole portion 900H of the substrate 900, the diameter (330φU) of the upper base of the truncated cone-shaped protruding portion 330, the diameter (330φD) of the lower base thereof, and the height 330h of the truncated cone shape, as described above. Thus, it is possible to arbitrarily adjust the allowable range ΔV of the vertical deformation and the allowable range ΔH of the horizontal deformation of the substrate 900 according to, for example, the thermal characteristics of the substrate 900.

In addition, as already described in the first or second configuration example of the present invention, the substrate 900 and the case 300 according to the third configuration example of the present invention, which are configured as described above, are fixed in combination with the motor output terminal 600, the connector section 700 and the like, as shown in FIG. 5. The substrate 900 is fixed to the case 300 as described in the first or second configuration example of the present invention with reference to FIGS. 6A and 6B. Meanwhile, in the third configuration example according to the present invention, when, for example, the hole portion 900H is formed as a through hole, the protruding portion 330 is disposed in a manner to be visible from the hole portion 900H of the substrate 900, as shown in FIG. 14 corresponding to FIG. 6B. In the substrate 900 according to the third configuration example of the present invention, the inverter section (an area surrounded by a bold dotted line in FIG. 14B) is disposed directly above the substrate placement surface 310 of the case body 300 via the thermal interface material TIM. In particular, the hole portion 900H formed in the substrate 900 is disposed at a position opposed to the truncated cone-shaped protruding portion 330 formed on the substrate placement surface 310.

Therefore, according to the third configuration example of the present invention as described above, it is possible to dispose the substrate placement surface 310 of the case body 300 and the substrate 900 in proximity to each other via the thermal interface material TIM. Thus, it is possible to effectively radiate the heat generated from the substrate 900 to the outside through the case body 300.

The hole portion 900H is formed in the substrate 900 at a position opposed to the truncated cone-shaped protruding portion 330 of the case body 300. In addition, the opening of the hole portion 900H on the back surface side of the substrate 900 is formed of the insulator section of the substrate 900. Therefore, even if the substrate 900 is warped due to the heat or the like, as described above, and deformed in the direction of the substrate placement surface 310, it is possible to prevent a further expansion of the warpage, and also possible to secure the electrical insulation very simply since the opening of the hole portion 900H on the back surface side of the substrate 900 comes into the contact with the inclined surface 330TS of the truncated cone-shaped protruding portion 330

Furthermore, the truncated cone-shaped protruding portion 330 has the inclined surface 330TH. Therefore, even if the opening of the hole portion 900H, formed on the back surface side of the substrate 900 is deformed in the horizontal direction along the plate surface of the substrate 900, a further deformation can be prevented since the opening of the hole portion 900H, formed on the back surface side of the substrate 900, comes into the contact with the inclined surface 330TS of the protruding portion 330 when the deformation exceeds a certain range.

Figure 15:
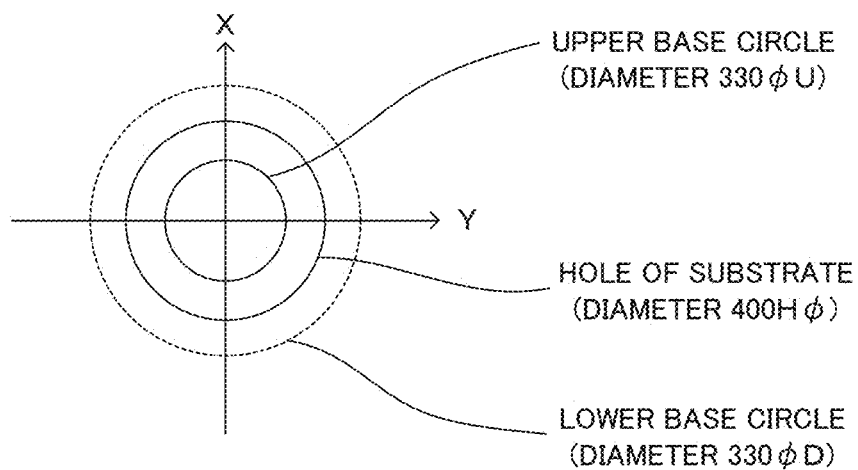
FIG. 15 is a top view schematically showing a relationship between a diameter of the hole portion formed in the substrate according to the third configuration example of the present invention, and diameters of an upper base circle and a lower base circle of the protruding portion formed on the substrate placement surface of the case.

Additionally, in the third configuration example according to the present invention, it is also possible to deal with the vertical distortion and also the horizontal distortion of the substrate 900, as described above. Thus, it is also possible to secure a clearance required for mounting the substrate 900 on the case 300, as shown in FIG. 15. Here, FIG. 15 is a top view schematically showing a relationship between a diameter of the hole portion 900H formed in the substrate 900 according to the third configuration example of the present invention, and diameters of an upper base circle and a lower base circle of the protruding portion 330 formed on the substrate placement surface 310 of the case 300.

That is, in the third configuration example according to the present invention, when virtual coordinates X and Y are set on the plate surface constituting the substrate 900, as shown in FIG. 15, the diameter (330φU) of the upper base circle forming the upper base of the truncated cone-shaped protruding portion 330 is smaller than that of the hole portion 900H (a diameter 400Hφ) of the substrate 900. In addition, the lower base circle (330φD) forming the lower base is larger than the hole (the diameter 400Hφ) of the substrate 900. Thus, the inclined surface 330TH and the hole portion 900H are formed in a manner where there is also a two-dimensional clearance in the X-direction and the Y-direction, with respect to the inclined surface 330TH and the opening of the hole portion 900H of the substrate 900. Therefore, the third configuration example of the present invention are effective against not only a positional difference in the Z-direction vertical to the plate surface of the substrate 900, but also a two-dimensional positional difference in the virtual coordinate X-direction and Y-direction set on the plate surface of the substrate 900. As a result, the present invention can effectively function even when the substrate 900 is mounted on the case 300, at a slightly different position.

As described above, according to the third configuration example of the present invention, it is possible to provide the structure of the substrate having the electronic parts mounted thereon and the case for housing the substrate, which can achieve the following. While the substrate having the electronic parts mounted thereon and the case for housing the substrate are disposed in proximity to each other as much as possible so as to improve the heat radiation, it is possible to secure the electrical insulation by preventing the unnecessary electrical contact between the substrate and the substrate placement surface, which has not been intended in advance, even if the substrate and the substrate placement surface of the case come into the contact with each other due to the warpage of the substrate caused by the thermal deformation, the aged deterioration or the like. In addition, it is possible to suppress the vertical and horizontal distortions of the substrate within the certain limit while allowing the vertical and horizontal distortions of the substrate.

As well, the third configuration example according to the present invention described above exemplifies the configuration of the present invention, and the present invention is not limited thereto. Thus, it is also possible to make various modifications within the scope of the gist of the present invention.

Therefore, in the third configuration example according to the present invention, it is possible to adopt the shape and the disposition of the screw hole for fixing the substrate, as shown in FIGS. 8A and 8B in relation to the second configuration example, since the deformation or the distortion in the horizontal direction of the substrate can be dealt with to some extent. Alternatively, it is possible to enhance the performance of dealing with the distortion in the horizontal direction of the substrate 900 according to the third configuration example of the present invention, and also possible to relieve the internal stress on the substrate 900, by enlarging the inner diameter of a screw hole 403, which is formed in the substrate 900 for fixing the substrate 900, as shown in FIGS. 16A and 16B.

Figure 16A:
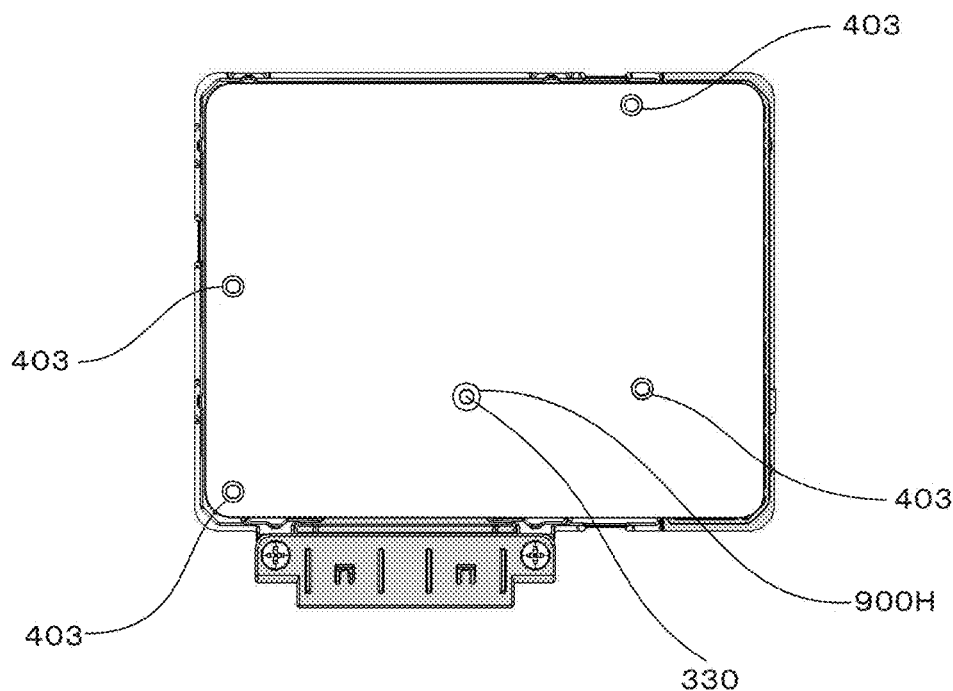
FIGS. 16A and 16B show the substrate disposed on the case body according to the third configuration example of the present invention.
Figure 16B:
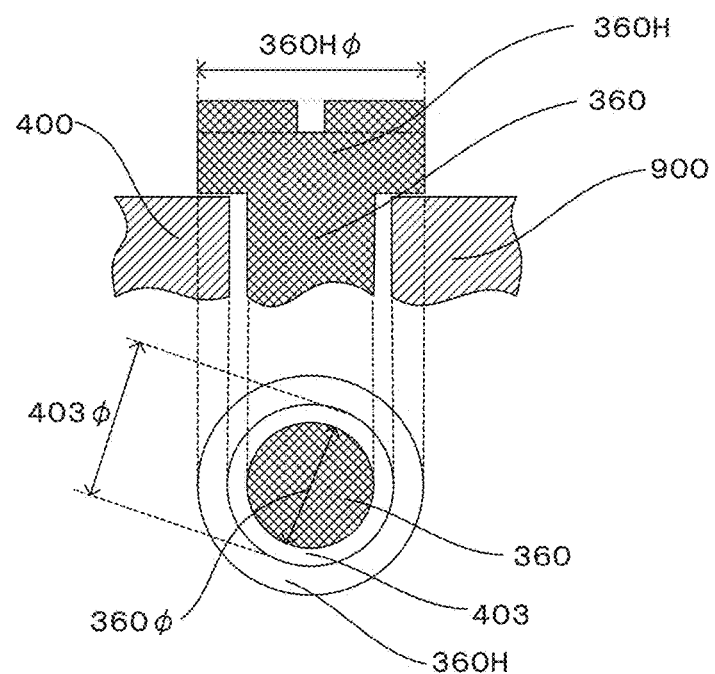
Figure 17:
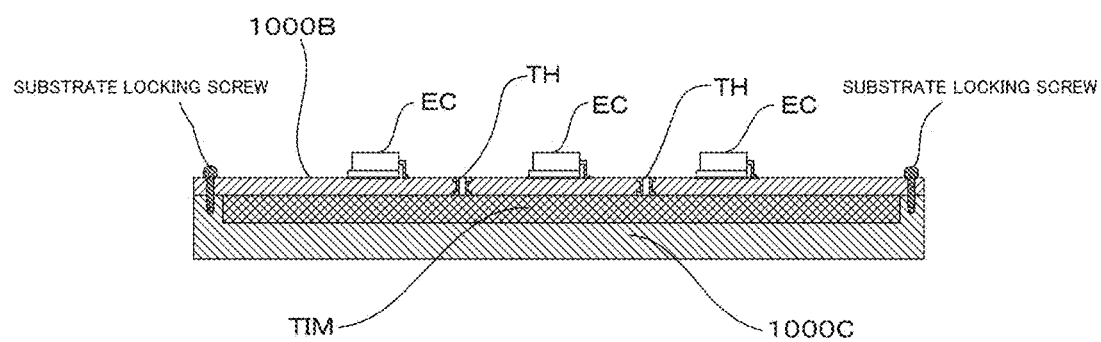
FIG. 17 is a sectional side view showing a conventional example of the substrate disposed on the substrate placement surface of the case via the thermal interface material.

Here, FIGS. 16A and 16B show the substrate 900 disposed on the case body 300. FIG. 16A is a top view showing an example of the entire substrate 900 with the screw holes 403 thereof having a circular inner diameter 403φ which is larger than an outer diameter 364 of a shank of a screw 360. FIG. 16B shows a comparison between a top view (the lower part of the drawing) of the screw hole 403 of the substrate 900, and a sectional side view (the upper part of the drawing) of the substrate 900 fixed with the screw 360. (The electronic parts EC and the like to be mounted are omitted here.)

In the example of FIGS. 16A and 16B, the inner diameter 403φ of the circular shape of the screw hole 403 of the substrate 900 is larger than the outer diameter 360φ of the shank of the screw 360, and the outer diameter 360Hφ of a screw head 360H of the screw 360 is larger than the inner diameter of the circular shape of the screw hole 403.

Therefore, with such a configuration, the substrate 900 can deal with the deformation or the distortion in the horizontal direction of the substrate 900 between the screw head 360H and the locking section 313 or the substrate locking pillar 353 of the case body 300, by an amount corresponding to the difference between the inner diameter 403φ of the screw hole 403 and the outer diameter 360φ of the shank of the screw 360. Thus, it is possible to deal with the warpage of the substrate by means of the truncated cone-shaped protruding portion 330 according to the third configuration example of the present invention, and also possible to relieve the internal stress on the substrate 900. Such a configuration can also be applied to the second configuration example of the present invention.

EXPLANATION OF REFERENCE NUMERALS 1 steering wheel (handle)
2 column shaft (steering shaft, steering wheel shaft)
3 reduction mechanism
4a,4b universal joint
5 pinion rack mechanism
6a, 6b tie rod
7a, 7b hub unit
8L, 8R steered wheel
10 torque sensor
11 ignition key
12 vehicle speed sensor
13 battery
14 steering angle sensor
20 electric motor
23 motor relay
100 control unit (ECU)
101 current command value calculating section
104 PI-control section
105 PWM-control section
106 inverter
110 compensation signal generating section
300 case (case body)
310 substrate placement surface
313 locking section
330 truncated cone-shaped protruding portion
330φU diameter of upper base of truncated cone shape
330φD diameter of lower base of truncated cone shape
330h height of truncated cone shape
330TS inclined surface of truncated cone shape
330C insulating material (one of protruding portion caps)
353 substrate locking pillar
360, 660, 760 screw
360φ outer diameter of shank of screw
360Hφ outer diameter of screw head
400, 800, 900 substrate (including multilayer substrate)
900d thickness of substrate
900H hole portion (hole) of substrate
900Hφ inner diameter of hole portion of substrate
403 screw hole of substrate
403φ inner diameter of screw hole of substrate
403L long axis of screw hole of substrate
403S short axis of screw hole of substrate
500 case cover
600 motor output terminal
613 motor output terminal locking section
700 connector (connector section)
810 electrical ground wiring section of substrate
1000B general integrated substrate
1000C general case
C cap of protruding portion
TH through hole
TIM thermal interface material
d distance between substrate placement surface and back surface of substrate (thickness of TIM)
T tapered surface formed in hole of substrate
ΔV allowable range of warpage
ΔH allowable range of distortion in horizontal direction
EC, EC (FET) electronic parts such as FET
K frame indicated by chain line in FIG. 10A
L frame indicated by chain line in FIG. 10C

The invention claimed is:

1. A structure of a substrate having electronic parts mounted thereon and a case for housing the substrate, wherein said case has a substrate placement surface for placing said substrate, said substrate placement surface is provided with a protruding portion protruding therefrom, said substrate is fixed on said substrate placement surface, via a thermal interface material having an insulation property disposed on said substrate placement surface from a periphery of said protruding portion, a hole portion is formed on a back surface side of said substrate at a position to be opposed to said protruding portion of said substrate placement surface based on said fixation, said protruding portion has a truncated cone shape with said substrate placement surface as a base, a diameter of an upper base of said truncated cone shape is smaller than an inner diameter of said hole portion of said substrate, a diameter of a lower base of said truncated cone shape is larger than said inner diameter of said hole portion of said substrate, and a height of said truncated cone shape is larger than a distance between said substrate placement surface and a back surface of said substrate based on said fixation, an upper base section of said protruding portion and a part of an inclined surface of said truncated cone shape enter inside said substrate from said hole portion provided in said substrate on said back surface side of said substrate without being in contact with said substrate, and an expansion of a warpage is suppressed by an opening of said hole portion on said back surface side of said substrate coming into a contact with said inclined surface of said truncated cone shape forming said protruding portion when said substrate deforms due to said warpage in a direction of said substrate placement surface; and wherein a tapered surface parallel to said inclined surface of said truncated cone shape is provided on a bottom peripheral portion of said opening of said hole portion on said back surface side of said substrate, which is to be brought into a contact with said inclined surface of said truncated cone shape forming said protruding portion of said case.

2. The structure of the substrate having the electronic parts mounted thereon and the case for housing the substrate according to claim 1,
wherein said hole portion of said substrate is formed to penetrate through said substrate from a front surface to said back surface, and
wherein said height of said truncated cone shape forming said protruding portion is lower than said height from said substrate placement surface to said front surface of said substrate based on said fixation.

3. The structure of the substrate having the electronic parts mounted thereon and the case for housing the substrate according to claim 1, wherein
said opening of said hole portion on said back surface side of said substrate, which is to be brought into a contact with said inclined surface of said truncated cone shape forming said protruding portion of said case, is formed of an insulator section of said substrate.

4. The structure of the substrate having the electronic parts mounted thereon and the case for housing the substrate according to claim 1, wherein
said protruding portion is provided at or in a vicinity of a position to be opposed to a position that is predicted as a center of a warpage due to a thermal deformation of said substrate when said substrate is disposed on said substrate placement surface, or a geometric center of said substrate placement surface or in a vicinity of said geometric center.

5. An electric power steering apparatus comprising a control unit having the structure of the substrate having the electronic parts mounted thereon and the case for housing the substrate according to claim 1.

6. A structure of a substrate having electronic parts mounted thereon and a case for housing the substrate, wherein said case has a substrate placement surface for placing said substrate, said substrate placement surface is provided with a protruding portion protruding therefrom, said substrate is fixed on said substrate placement surface, via a thermal interface material having an insulation property disposed on said substrate placement surface from a periphery of said protruding portion, said protruding portion is provided at or in a vicinity of a position to be opposed to a position that is predicted as a center of a warpage due to a thermal deformation of said substrate when said substrate is disposed on said substrate placement surface, or a geometric center of said substrate placement surface or in a vicinity of said geometric center, a height of said protruding portion protruding from said substrate placement surface is equal to a height of said thermal interface material disposed on said substrate placement surface from said periphery of said protruding portion, from said substrate placement surface, said substrate placement surface is formed of a conductor, and an insulator part of said substrate is disposed at a part of said substrate to be opposed to said protruding portion on said substrate placement surface when said substrate is mounted on said substrate placement surface of said case; and wherein said mounting of said substrate on said substrate placement surface is implemented while said substrate is locked with both or either plural locking sections projecting from said substrate placement surface configured to mount said substrate and/or plural substrate locking pillars disposed on a periphery of said substrate placement surface, and wherein a height of an upper end of said locking section and a height of an upper end of said substrate locking pillar are substantially equal to a height of said thermal interface material from said substrate placement surface, as viewed from said substrate placement surface.

7. The structure of the substrate having the electronic parts mounted thereon and the case for housing the substrate according to claim 6, wherein
said protruding portion is covered with a cap made of a nonconductor.

8. A structure of a substrate having electronic parts mounted thereon and a case for housing the substrate, wherein said case has a substrate placement surface for placing said substrate, said substrate placement surface is provided with a protruding portion protruding therefrom, said substrate is fixed on said substrate placement surface, via a thermal interface material having an insulation property disposed on said substrate placement surface from a periphery of said protruding portion, said protruding portion is provided at or in a vicinity of a position to be opposed to a position that is predicted as a center of a warpage due to a thermal deformation of said substrate when said substrate is disposed on said substrate placement surface, or a geometric center of said substrate placement surface or in a vicinity of said geometric center, a height of said protruding portion protruding from said substrate placement surface is equal to a height of said thermal interface material disposed on said substrate placement surface from said periphery of said protruding portion, from said substrate placement surface, said substrate placement surface is formed of a conductor, and said protruding portion is brought into a contact with said substrate at an electrical ground wiring part of a circuit pattern formed on a side of said substrate facing said substrate placement surface; and wherein said mounting of said substrate on said substrate placement surface is implemented while said substrate is locked with both or either plural locking sections projecting from said substrate placement surface configured to mount said substrate and/or plural substrate locking pillars disposed on a periphery of said substrate placement surface, and wherein a height of an upper end of said locking section and a height of an upper end of said substrate locking pillar are substantially equal to a height of said thermal interface material from said substrate placement surface, as viewed from said substrate placement surface.

9. The structure of the substrate having the electronic parts mounted thereon and the case for housing the substrate according to claim 8,
    wherein said substrate is a multilayer substrate,
    wherein said multilayer substrate is provided with a through hole mutually connecting said electrical ground wiring parts of said circuit patterns formed on respective layers of said multilayer substrate, and
    wherein said electrical ground wiring part of said circuit pattern formed on said side of said substrate facing said substrate placement surface of said case, includes a land part of said through hole, formed on said side of said multilayer substrate facing said substrate placement surface.

10. The structure of the substrate having the electronic parts mounted thereon and the case for housing the substrate according to claim 8,
    wherein plural screw holes for locking said substrate to said case are disposed on said substrate,
    wherein said screw holes have an elliptical shape, and
    wherein a long axis of said elliptical shape is arranged in a radial direction from a position opposed to said protruding portion so that a stress on said substrate is relieved by distorting said substrate, which is fixed on said screw holes, in said long axis direction depending on a thermal deformation, an aged deterioration or the like.

11. The structure of the substrate having the electronic parts mounted thereon and the case for housing the substrate according to claim 8, wherein
    said plural protruding portions are provided on said substrate placement surface.

12. The structure of the substrate having the electronic parts mounted thereon and the case for housing the substrate according to claim 8, wherein
    said substrate placement surface has a heat radiation function.

13. The structure of the substrate having the electronic parts mounted thereon and the case for housing the substrate according to claim 8,
    wherein said substrate is an integrated substrate formed of a power substrate and a control substrate integrated as a single substrate, and
    wherein at least a power module section of said integrated substrate, formed on said power substrate, is disposed on said substrate placement surface of said case.

* * * * *